(12) United States Patent
Takahashi et al.

(10) Patent No.: US 10,497,330 B2
(45) Date of Patent: Dec. 3, 2019

(54) DISPLAY DEVICE THAT PERFORMS PAUSE DRIVING

(71) Applicant: Sharp Kabushiki Kaisha, Sakai, Osaka (JP)

(72) Inventors: Kazuki Takahashi, Sakai (JP); Jin Miyazawa, Sakai (JP); Kazuo Nakamura, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 1 day.

(21) Appl. No.: 15/774,015

(22) PCT Filed: Nov. 25, 2016

(86) PCT No.: PCT/JP2016/084935
§ 371 (c)(1),
(2) Date: May 7, 2018

(87) PCT Pub. No.: WO2017/094605
PCT Pub. Date: Jun. 8, 2017

(65) Prior Publication Data
US 2018/0322843 A1 Nov. 8, 2018

(30) Foreign Application Priority Data
Dec. 2, 2015 (JP) ................. 2015-235320

(51) Int. Cl.
G09G 3/36 (2006.01)
G02F 1/133 (2006.01)
(Continued)

(52) U.S. Cl.
CPC ......... *G09G 3/3677* (2013.01); *G02F 1/1368* (2013.01); *G02F 1/13306* (2013.01);
(Continued)

(58) Field of Classification Search
CPC .. G09G 3/3677; G09G 3/3611; G09G 3/3648; G09G 3/3688; G09G 2330/021;
(Continued)

(56) References Cited

U.S. PATENT DOCUMENTS

2009/0219295 A1* 9/2009 Reijnaerts ............. G06F 3/1415
345/501
2012/0138922 A1 6/2012 Yamazaki et al.
(Continued)

FOREIGN PATENT DOCUMENTS

JP 2003-036046 A 2/2003
JP 2012-134475 A 7/2012
(Continued)

OTHER PUBLICATIONS

English translation of Official Communication issued in International Patent Application No. PCT/JP2016/084935, dated Jun. 29, 2018.
(Continued)

Primary Examiner — Xuemei Zheng
(74) Attorney, Agent, or Firm — Keating & Bennett, LLP

(57) ABSTRACT

An object of the present invention is to further reduce the power consumption of a display device adopting pause driving. In a display device that includes a display driving unit (30) that drives a display unit (400); and a power supply circuit (20) that generates a plurality of operation voltages to be supplied to the display driving unit (30), and performs pause driving that repeats a scanning period during which gate bus lines (GL) are scanned and a pause period during which the scanning of the gate bus lines (GL) is stopped, the display driving unit (30) provides a control signal (SM) indicating whether the current point in time is the scanning period or the pause period, to the power supply circuit (20), and the power supply circuit (20) makes the voltage value of
(Continued)

at least one of the plurality of operation voltages supplied to the display driving unit (30) smaller during the pause period than during the scanning period, based on the control signal (SM).

12 Claims, 24 Drawing Sheets

(51) Int. Cl.
      *G02F 1/1343*     (2006.01)
      *G02F 1/1362*     (2006.01)
      *G02F 1/1368*     (2006.01)
      *H01L 27/12*      (2006.01)

(52) U.S. Cl.
    CPC .. *G02F 1/134309* (2013.01); *G02F 1/136286* (2013.01); *H01L 27/124* (2013.01); *H01L 27/1225* (2013.01); *G02F 2201/123* (2013.01); *G09G 2300/0439* (2013.01); *G09G 2300/0809* (2013.01); *G09G 2310/0264* (2013.01); *G09G 2310/08* (2013.01); *G09G 2330/021* (2013.01)

(58) Field of Classification Search
    CPC ....... G09G 2310/08; G09G 2340/0435; G09G 3/3225; G09G 2310/0243; G09G 2310/0264
    See application file for complete search history.

(56) References Cited

U.S. PATENT DOCUMENTS

| | | |
|---|---|---|
| 2013/0135282 A1 | 5/2013 | Jeon |
| 2013/0320334 A1 | 12/2013 | Yamazaki et al. |
| 2014/0022234 A1* | 1/2014 | Ogawa ................ G06F 1/3265 345/213 |
| 2014/0028646 A1 | 1/2014 | Saitoh et al. |
| 2014/0286076 A1 | 9/2014 | Aoki et al. |
| 2017/0148390 A1* | 5/2017 | Park ..................... G06F 1/3296 |

FOREIGN PATENT DOCUMENTS

| | | |
|---|---|---|
| JP | 2013-114260 A | 6/2013 |
| JP | 2014-007399 A | 1/2014 |
| JP | 2014-209727 A | 11/2014 |
| WO | 2012/137756 A1 | 10/2012 |

OTHER PUBLICATIONS

English translation of Official Communication issued in International Patent Application No. PCT/JP2016/084935, dated Feb. 14, 2017.

Official Communication issued in International Patent Application PCT/JP2016/084935, dated Feb. 14, 2017.

* cited by examiner

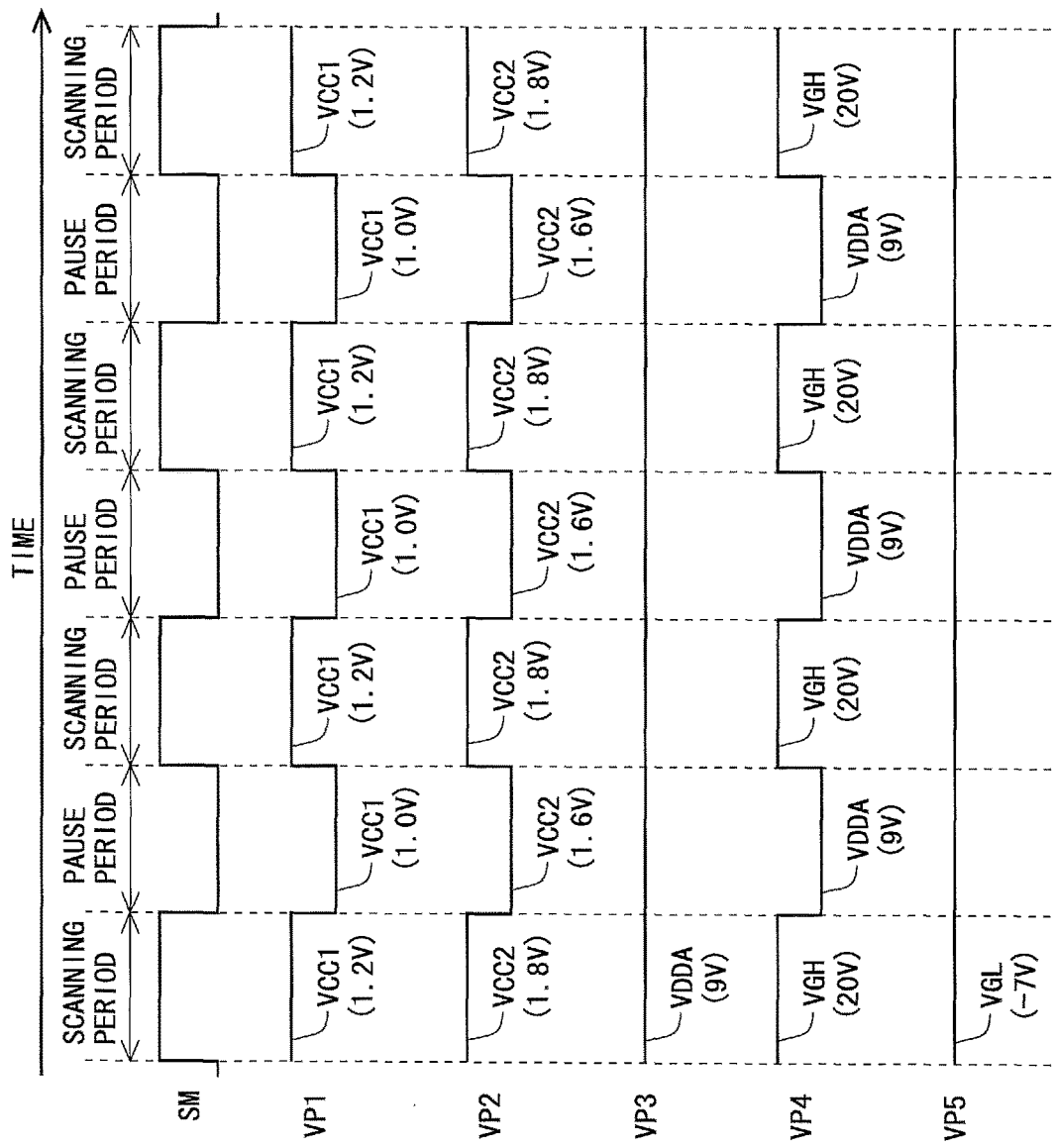

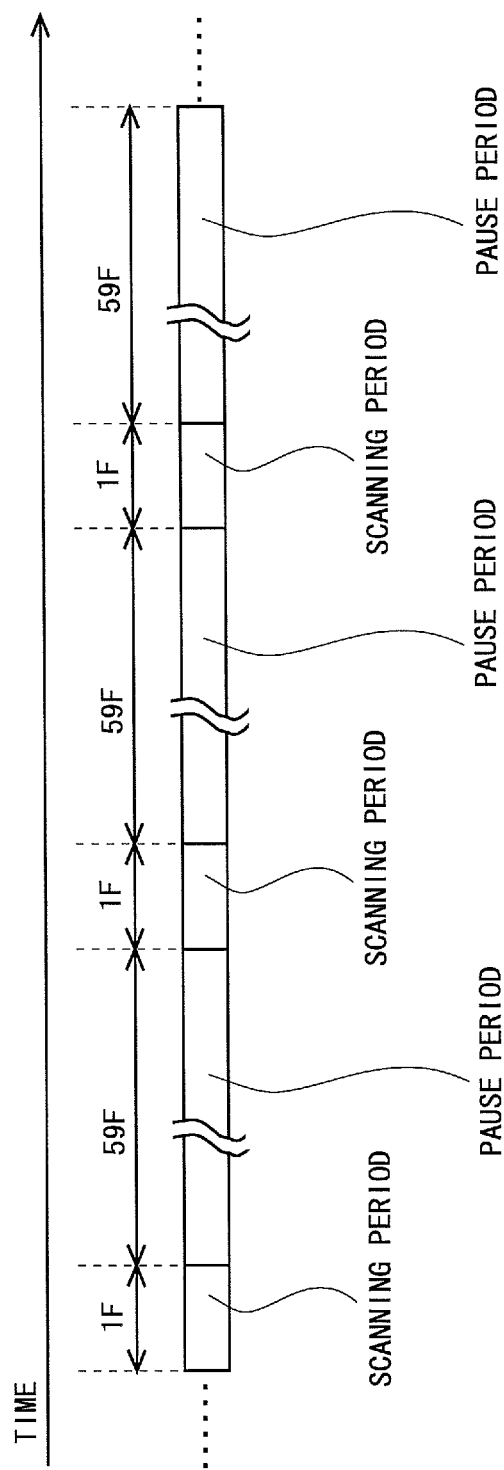

DISPLAY DEVICE THAT PERFORMS PAUSE DRIVING

TECHNICAL FIELD

The present invention relates to a display device and more particularly to a display device that performs pause driving and a driving method for the display device.

BACKGROUND ART

A liquid crystal display device generally includes a liquid crystal panel composed of two insulating glass substrates facing each other. One of the glass substrates is called an array substrate and the other is called a counter substrate. The array substrate has thin film transistors (TFTs), pixel electrodes, etc., formed thereon, and the counter substrate has a common electrode (counter electrode), color filters, etc., formed thereon. In a display unit (display region) of the liquid crystal panel there are formed a plurality of source bus lines (video signal lines), a plurality of gate bus lines (scanning signal lines), and a plurality of pixel formation portions provided at the respective intersections of the plurality of source bus lines and the plurality of gate bus lines. Each pixel formation portion includes a TFT connected at its gate electrode to a gate bus line passing through a corresponding intersection, and connected at its source electrode to a source bus line passing through the intersection; a pixel electrode connected to a drain electrode of the TFT; the common electrode and an auxiliary capacitance electrode which are provided so as to be shared by the plurality of pixel formation portions; a liquid crystal capacitance formed by the pixel electrode and the common electrode; and an auxiliary capacitance formed by the pixel electrode and the auxiliary capacitance electrode. By the liquid crystal capacitance and the auxiliary capacitance, a pixel capacitance is formed. In a configuration such as that described above, a pixel capacitance is charged based on a video signal that is received from a source bus line by the source electrode of a TFT when the gate electrode of the TFT receives an active scanning signal from a gate bus line. By thus charging the pixel capacitances in the plurality of pixel formation portions, a desired image is displayed on the display unit.

Meanwhile, regarding display devices such as the above-described liquid crystal display device, conventionally, there is a problem of a reduction in power consumption. Hence, the development of a driving method that "provides a pause period during which video signal write operation is paused by stopping the scanning of the gate bus lines (provides a pause period between scanning periods)" is progressing. The driving method that thus provides a pause period during which write operation is paused is called "pause driving", etc. Note that in a general liquid crystal display device, too, the gate bus lines are not scanned during a flyback period, but the flyback period is a part of a scanning period, and in pause driving a pause period longer than the flyback period is provided. In a liquid crystal display device adopting such pause driving, during the pause period, signals for control, etc., do not need to be provided to drivers (drive circuits) such as a gate driver and a source driver, for example. Hence, the driving frequency of the drivers, etc., decreases as a whole, enabling to achieve a reduction in power consumption.

FIG. 27 is a diagram for describing an example of pause driving. In the example shown in FIG. 27, a scanning period for one frame (one frame period is 16.67 ms) of a general liquid crystal display device whose refresh rate (driving frequency) is 60 Hz and a pause period for 59 frames appear alternately. Such pause driving is ideal for still image display. An invention of a liquid crystal display device that performs such pause driving is disclosed in, for example, WO 2012/137756 A.

PRIOR ART DOCUMENT

Patent Document

[Patent Document 1] WO 2012/137756 A

SUMMARY OF THE INVENTION

Problems to be Solved by the Invention

By pause driving such as that described above, a reduction in power consumption of a display device is achieved. However, in recent years, there has been a remarkable increase in resolution of a display device. In addition, in recent years, particularly for a portable display device, there has been a remarkable increase in user's use time. Due to such circumstances, there has been an increasing demand for a further reduction in power consumption of a display device.

An object of the present invention is therefore to further reduce the power consumption of a display device adopting pause driving.

Means for Solving the Problems

A first aspect of the present invention is directed to a display device having a display unit that includes a video signal line and a scanning signal line, and performing pause driving that repeats a scanning period during which the scanning signal line is scanned and a pause period during which the scanning of the scanning signal line is stopped, the display device including:
a display driving unit configured to drive the display unit; and
a power supply circuit configured to generate a plurality of operation voltages to be supplied to the display driving unit, wherein
the display driving unit provides a control signal to the power supply circuit, the control signal indicating whether a current point in time is the scanning period or the pause period, and
the power supply circuit makes a voltage value of at least one of the plurality of operation voltages supplied to the display driving unit smaller during the pause period than during the scanning period, based on the control signal.

According to a second aspect of the present invention, in the first aspect of the present invention,
the display driving unit includes:
a video signal line drive circuit configured to drive the video signal line;
a scanning signal line drive circuit configured to drive the scanning signal line; and
a timing control circuit configured to control operation of the video signal line drive circuit and the scanning signal line drive circuit, and
the control signal is provided to the power supply circuit from the timing control circuit.

According to a third aspect of the present invention, in the second aspect of the present invention, the power supply circuit:

generates, as the plurality of operation voltages, at least an analog power supply voltage to be supplied to the video signal line drive circuit, and a scanning signal line selection power supply voltage to be supplied to the scanning signal line drive circuit, the scanning signal line selection power supply voltage being a voltage for bringing the scanning signal line into a selected state; and supplies the analog power supply voltage to the scanning signal line drive circuit during the pause period, instead of the scanning signal line selection power supply voltage.

According to a fourth aspect of the present invention, in the second aspect of the present invention, the power supply circuit:

generates, as one of the plurality of operation voltages, at least a first logic power supply voltage to be supplied to the timing control circuit; and makes a voltage value of the first logic power supply voltage smaller during the pause period than during the scanning period.

According to a fifth aspect of the present invention, in the second aspect of the present invention, the power supply circuit:

generates, as one of the plurality of operation voltages, at least a second logic power supply voltage to be supplied to the video signal line drive circuit; and makes a voltage value of the second logic power supply voltage smaller during the pause period than during the scanning period.

According to a sixth aspect of the present invention, in the second aspect of the present invention, the power supply circuit:

generates, as the plurality of operation voltages, at least a first logic power supply voltage to be supplied to the timing control circuit and a second logic power supply voltage to be supplied to the video signal line drive circuit; and makes a voltage value of the first logic power supply voltage and a voltage value of the second logic power supply voltage smaller during the pause period than during the scanning period.

According to a seventh aspect of the present invention, in the second aspect of the present invention, the power supply circuit:

generates, as the plurality of operation voltages, at least an analog power supply voltage to be supplied to the video signal line drive circuit, a scanning signal line selection power supply voltage to be supplied to the scanning signal line drive circuit, and a first logic power supply voltage to be supplied to the timing control circuit, the scanning signal line selection power supply voltage being a voltage for bringing the scanning signal line into a selected state; and supplies the analog power supply voltage to the scanning signal line drive circuit during the pause period, instead of the scanning signal line selection power supply voltage, and makes a voltage value of the first logic power supply voltage smaller during the pause period than during the scanning period.

According to an eighth aspect of the present invention, in the second aspect of the present invention, the power supply circuit:

generates, as the plurality of operation voltages, at least an analog power supply voltage to be supplied to the video signal line drive circuit, a scanning signal line selection power supply voltage to be supplied to the scanning signal line drive circuit, and a second logic power supply voltage to be supplied to the video signal line drive circuit, the scanning signal line selection power supply voltage being a voltage for bringing the scanning signal line into a selected state; and supplies the analog power supply voltage to the scanning signal line drive circuit during the pause period, instead of the scanning signal line selection power supply voltage, and makes a voltage value of the second logic power supply voltage smaller during the pause period than during the scanning period.

According to a ninth aspect of the present invention, in the second aspect of the present invention, the power supply circuit:

generates, as the plurality of operation voltages, at least an analog power supply voltage to be supplied to the video signal line drive circuit, a scanning signal line selection power supply voltage to be supplied to the scanning signal line drive circuit, a first logic power supply voltage to be supplied to the timing control circuit, and a second logic power supply voltage to be supplied to the video signal line drive circuit, the scanning signal line selection power supply voltage being a voltage for bringing the scanning signal line into a selected state; and supplies the analog power supply voltage to the scanning signal line drive circuit during the pause period, instead of the scanning signal line selection power supply voltage, and makes a voltage value of the first logic power supply voltage and a voltage value of the second logic power supply voltage smaller during the pause period than during the scanning period.

According to a tenth aspect of the present invention, in the first aspect of the present invention, the display unit includes:

a pixel electrode; and a thin film transistor having a control terminal connected to the scanning signal line, a first conduction terminal connected to the video signal line, and a second conduction terminal connected to the pixel electrode, the thin film transistor having an oxide semiconductor layer.

According to an eleventh aspect of the present invention, in the tenth aspect of the present invention, the oxide semiconductor layer contains indium gallium zinc oxide.

According to a twelfth aspect of the present invention, in the first aspect of the present invention, a length of the pause period is longer than a length of the scanning period.

A thirteenth aspect of the present invention is directed to a driving method for a display device having a display unit that includes a video signal line and a scanning signal line; and a display driving unit configured to drive the display unit, and performing pause driving that repeats a scanning period during which the scanning signal line is scanned and a pause period during which the scanning of the scanning signal line is stopped, the driving method comprising:

a power supply generating step of generating a plurality of operation voltages to be supplied to the display driving unit; and a control signal outputting step of outputting a control signal indicating whether a current point in time is the scanning period or the pause period, wherein in the power supply generating step, a voltage value of at least one of the plurality of operation voltages supplied to the display driving unit is made smaller during the pause period than during the scanning period, based on the control signal outputted in the control signal outputting step.

Effects of the Invention

According to the first aspect of the present invention, in the display device that performs pause driving, the voltage value of at least one of a plurality of operation voltages required for the operation of the display driving unit is made smaller during the pause period than during the scanning period. By this, the display device that performs pause driving further reduces power consumption over the conventional display device.

According to the second aspect of the present invention, the display device having the video signal line drive circuit, the scanning signal line drive circuit, and the timing control circuit further reduces power consumption over the conventional display device.

According to the third aspect of the present invention, during the pause period, an analog power supply voltage lower in voltage level than a scanning signal line selection power supply voltage is supplied to the scanning signal line drive circuit. By this, the display device that performs pause driving further reduces power consumption over the conventional display device.

According to the fourth aspect of the present invention, the voltage value of a first logic power supply voltage supplied to the timing control circuit is made smaller during the pause period than during the scanning period. By this, the display device that performs pause driving further reduces power consumption over the conventional display device.

According to the fifth aspect of the present invention, the voltage value of a second logic power supply voltage supplied to the video signal line drive circuit is made smaller during the pause period than during the scanning period. By this, the display device that performs pause driving further reduces power consumption over the conventional display device.

According to the sixth aspect of the present invention, the voltage value of a first logic power supply voltage supplied to the timing control circuit and the voltage value of a second logic power supply voltage supplied to the video signal line drive circuit are made smaller during the pause period than during the scanning period. By this, the display device that performs pause driving further reduces power consumption over the conventional display device.

According to the seventh aspect of the present invention, during the pause period, an analog power supply voltage lower in voltage level than a scanning signal line selection power supply voltage is supplied to the scanning signal line drive circuit. In addition, the voltage value of a first logic power supply voltage supplied to the timing control circuit is made smaller during the pause period than during the scanning period. By this, the display device that performs pause driving further reduces power consumption over the conventional display device.

According to the eighth aspect of the present invention, during the pause period, an analog power supply voltage lower in voltage level than a scanning signal line selection power supply voltage is supplied to the scanning signal line drive circuit. In addition, the voltage value of a second logic power supply voltage supplied to the video signal line drive circuit is made smaller during the pause period than during the scanning period. By this, the display device that performs pause driving further reduces power consumption over the conventional display device.

According to the ninth aspect of the present invention, during the pause period, an analog power supply voltage lower in voltage level than a scanning signal line selection power supply voltage is supplied to the scanning signal line drive circuit. In addition, the voltage value of a first logic power supply voltage supplied to the timing control circuit is made smaller during the pause period than during the scanning period. Furthermore, the voltage value of a second logic power supply voltage supplied to the video signal line drive circuit is made smaller during the pause period than during the scanning period. By this, the display device that performs pause driving further reduces power consumption over the conventional display device.

According to the tenth aspect of the present invention, a thin film transistor having an oxide semiconductor layer is used. Hence, while excellent display quality is maintained, power consumption can be significantly reduced.

According to the eleventh aspect of the present invention, the same effect as that of the tenth aspect of the present invention can be securely provided.

According to the twelfth aspect of the present invention, power consumption can be more effectively reduced.

According to the thirteenth aspect of the present invention, the same effect as that of the first aspect of the present invention can be provided in an invention of a driving method for a display device.

BRIEF DESCRIPTION OF THE DRAWINGS

FIG. 26 is a timing chart for describing a voltage control method in the seventh embodiment.

FIG. 27 is a diagram for describing an example of pause driving.

MODES FOR CARRYING OUT THE INVENTION

Embodiments of the present invention will be described below with reference to the accompanying drawings. Note that in the following description, a gate electrode (gate terminal) of a TFT corresponds to a control terminal, a source electrode (source terminal) thereof corresponds to a first conduction terminal, and a drain electrode (drain terminal) thereof corresponds to a second conduction terminal.

1. First Embodiment

<1.1 Overall Configuration and Operation Overview>

Figure 1:
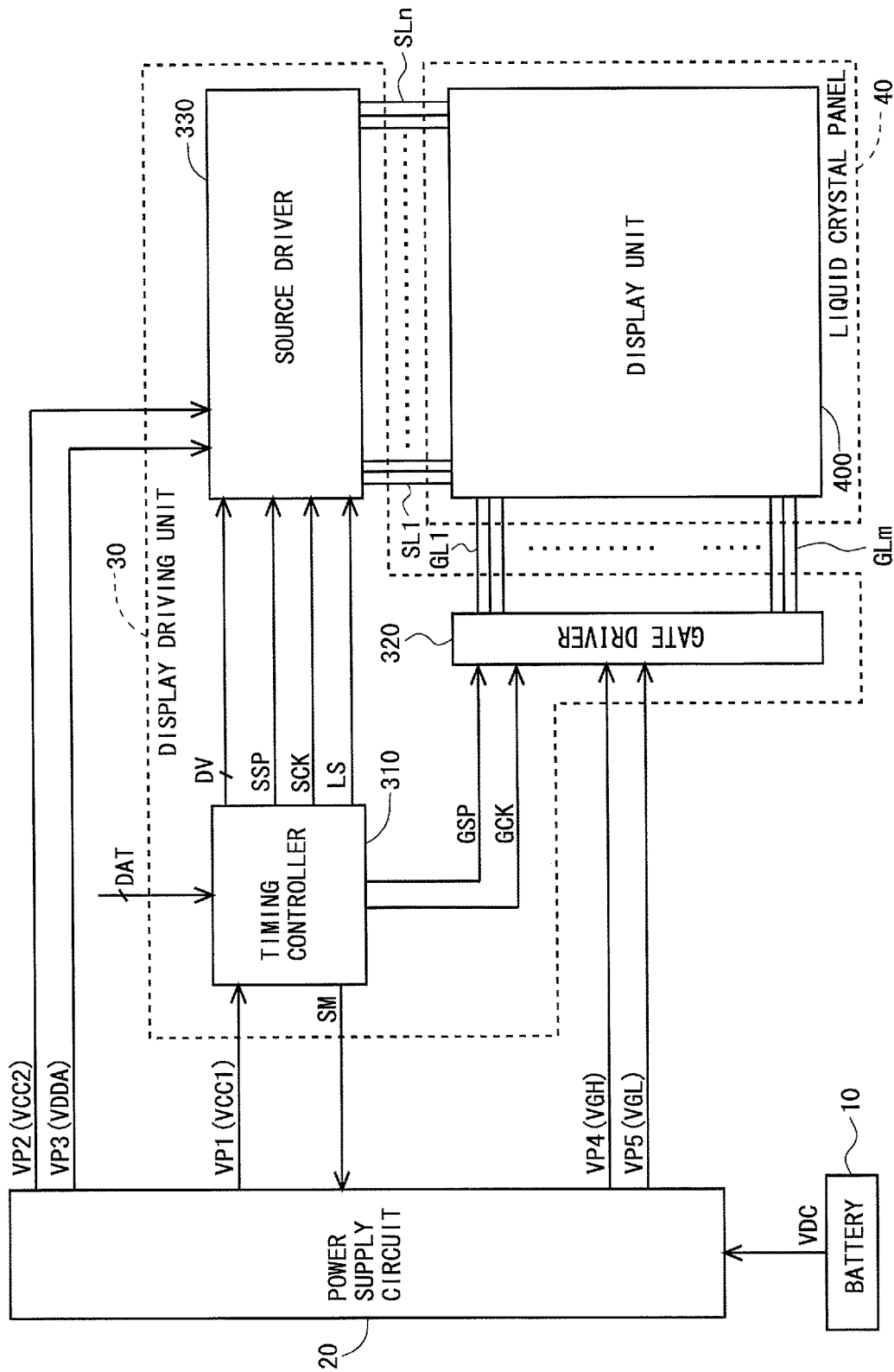
FIG. 1 is a block diagram showing an overall configuration of a liquid crystal display device according to a first embodiment of the present invention.
Figure 2:
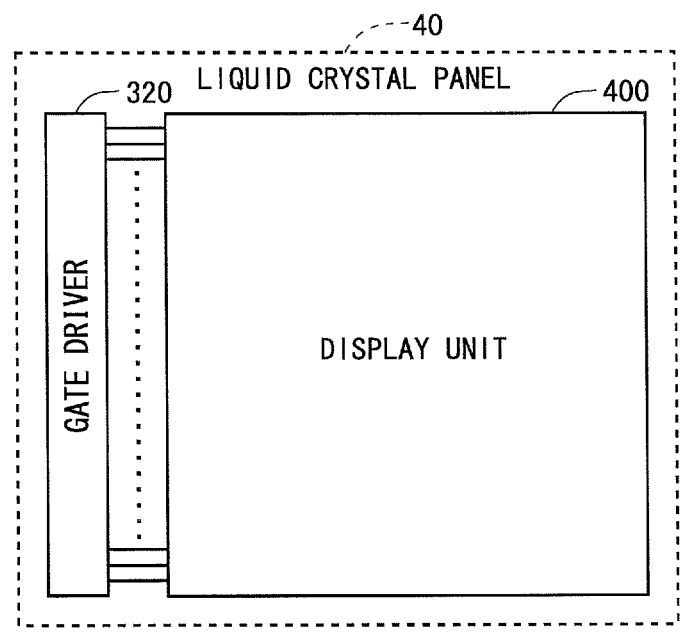
FIG. 2 is a diagram for describing another example of the placement of a gate driver regarding the first embodiment.

FIG. 1 is a block diagram showing an overall configuration of a liquid crystal display device according to a first embodiment of the present invention. As shown in FIG. 1, the liquid crystal display device includes a battery 10, a power supply circuit 20, a display driving unit 30, and a liquid crystal panel 40. The display driving unit 30 is composed of a timing controller 310, a gate driver (scanning signal line drive circuit) 320, and a source driver (video signal line drive circuit) 330. The liquid crystal panel 40 includes a display unit (pixel region) 400 that displays an image. Note that, as shown in FIG. 2, the gate driver 320 may be provided in the liquid crystal panel 40. That is, a gate driver that uses the technique called "gate driver monolithic (GDM)" can also be adopted.

The liquid crystal display device according to the present embodiment adopts pause driving as a driving method. That is, a pause period during which video signal write operation is paused by stopping the scanning of gate bus lines is provided during a period during which the liquid crystal display device is in operation. For example, while a scanning period and a pause period are repeated alternately as shown in FIG. 27, the length of the scanning period and the length of the pause period are not particularly limited in the present invention.

Figure 3:
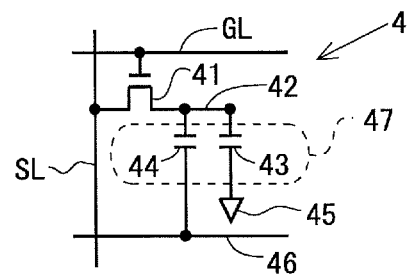
FIG. 3 is a diagram showing a configuration of a pixel formation portion in the first embodiment.

In the display unit 400 there are disposed a plurality of (n) source bus lines (video signal lines) SL1 to SLn and a plurality of (m) gate bus lines (scanning signal lines) GL1 to GLm. In addition, pixel formation portions (not shown in FIG. 1) each forming a pixel are provided at the respective intersections of the source bus lines SL1 to SLn and the gate bus lines GL1 to GLm. That is, the display unit 400 includes a plurality of (n×m) pixel formation portions. The plurality of pixel formation portions are arranged in a matrix form, forming a pixel matrix of m rows×n columns. FIG. 3 is a circuit diagram showing a configuration of a pixel formation portion 4. The pixel formation portion 4 includes a thin film transis (TFT) 41 which is a switching element connected at its gate electrode to a gate bus line GL passing through a corresponding intersection, and connected at its source electrode to a source bus line SL passing through the intersection; a pixel electrode 42 connected to a drain electrode of the TFT 41; a common electrode 45 and an auxiliary capacitance electrode 46 which are provided so as to be shared by the plurality of pixel formation portions 4; a liquid crystal capacitance 43 formed by the pixel electrode 42 and the common electrode 45; and an auxiliary capacitance 44 formed by the pixel electrode 42 and the auxiliary capacitance electrode 46. By the liquid crystal capacitance 43 and the auxiliary capacitance 44, a pixel capacitance 47 is formed. Note that the configuration of the pixel formation portion 4 is not limited to that shown in FIG. 3. For example, a configuration in which the auxiliary capacitance 44 and the auxiliary capacitance electrode 46 are not provided can also be adopted.

An operation overview of the components shown in FIG. 1 will be described below. The battery 10 supplies a direct-current voltage VDC of a predetermined magnitude to the power supply circuit 20. The power supply circuit 20 generates a plurality of operation voltages to be supplied to the display driving unit 30, based on a control signal SM provided from the timing controller 310. Note that the control signal SM is a signal indicating whether the current point in time is a scanning period or a pause period. In the present embodiment, the power supply circuit 20 generates, as the plurality of operation voltages, a timing controller logic power supply voltage VCC1 which is a logic system power supply voltage required for the operation of the timing controller 310; a source driver logic power supply voltage VCC2 which is a logic system power supply voltage required for the operation of the source driver 330; a source driver analog power supply voltage VDDA which is an analog system power supply voltage required for the operation of the source driver 330; a gate-on power supply voltage VGH which is a power supply voltage required for the operation of the gate driver 320 and used to bring the gate bus lines GL into a selected state; and a gate-off power supply voltage VGL which is a power supply voltage required for the operation of the gate driver 320 and used to bring the gate bus lines GL into a non-selected state.

Meanwhile, as will be described later, in this liquid crystal display device, the operation voltages supplied to the display driving unit 30 from the power supply circuit 20 differ between the scanning period and the pause period. Hence, in this specification, for convenience of description, the voltages supplied to the display driving unit 30 from the power supply circuit 20 are referred to as "first voltage" to "fifth voltage" regardless of the period. The first to fifth voltages are denoted by reference characters VP1 to VP5. The first voltage VP1 is a voltage supplied to the timing controller 310 from the power supply circuit 20. The second voltage VP2 is a logic system voltage supplied to the source driver 330 from the power supply circuit 20. The third voltage VP3 is an analog system voltage supplied to the source driver 330 from the power supply circuit 20. The fourth voltage VP4 is a high-level side voltage between two voltages supplied to the gate driver 320 from the power supply circuit 20. The fifth voltage VP5 is a low-level side voltage between the two voltages supplied to the gate driver 320 from the power supply circuit 20. Note that operation voltages supplied to the display driving unit 30 from the power supply circuit 20 during the scanning period are shown in parentheses following reference characters VP1 to VP5 in FIG. 1.

The timing controller 310 receives an image signal DAT which is transmitted from an external source, and outputs digital video signals DV, and a source start pulse signal SSP, a source clock signal SCK, a latch strobe signal LS, a gate start pulse signal GSP, and a gate clock signal GCK which are for controlling image display on the display unit 400. In addition, the timing controller 310 provides the above-described control signal SM to the power supply circuit 20 based on the image signal DAT.

The gate driver 320 repeats the application of active scanning signals to the respective gate bus lines GL1 to GLm, based on the gate start pulse signal GSP and the gate clock signal GCK which are outputted from the timing controller 310, with one vertical scanning period being a cycle.

The source driver 330 receives the digital video signals DV, source start pulse signal SSP, source clock signal SCK, and latch strobe signal LS which are transmitted from the timing controller 310, and applies driving video signals to the source bus lines SL1 to SLn. At this time, the source driver 330 sequentially holds the digital video signals DV indicating voltages to be applied to the respective source bus lines SL, at the timing of generation of pulses of the source clock signal SCK. Then, the held digital video signals DV are converted to analog voltages at the timing of generation of pulses of the latch strobe signal LS. The converted analog voltages are applied to all source bus lines SL1 to SLn at once as driving video signals.

In the above-described manner, the scanning signals are applied to the gate bus lines GL1 to GLm, respectively, and the driving video signals are applied to the source bus lines SL1 to SLn, respectively, by which an image based on the image signal DAT transmitted from the external source is displayed on the display unit 400.

Note that the timing controller logic power supply voltage VCC1 corresponds to a first logic power supply voltage, the source driver logic power supply voltage VCC2 corresponds to a second logic power supply voltage, the source driver analog power supply voltage VDDA corresponds to an analog power supply voltage, and the gate-on power supply voltage VGH corresponds to a scanning signal line selection power supply voltage.

<1.2 Thin Film Transistor (TFT)>

In the present embodiment, the TFTs 41 in the respective pixel formation portions 4 are all of an n-channel type. In addition, in the present embodiment, for the TFTs 41, an oxide TFT (a thin film transistor having an oxide semiconductor layer) is adopted. Furthermore, in the present embodiment, for the structure of the TFTs 41, a channel-etched type is adopted. Note, however, that an etch-stop type can also be adopted. By thus using an oxide TFT, while excellent display quality is maintained, the number of times the liquid crystal panel 40 is driven is significantly reduced, enabling to significantly reduce the power consumption of the liquid crystal display device.

Figure 4:
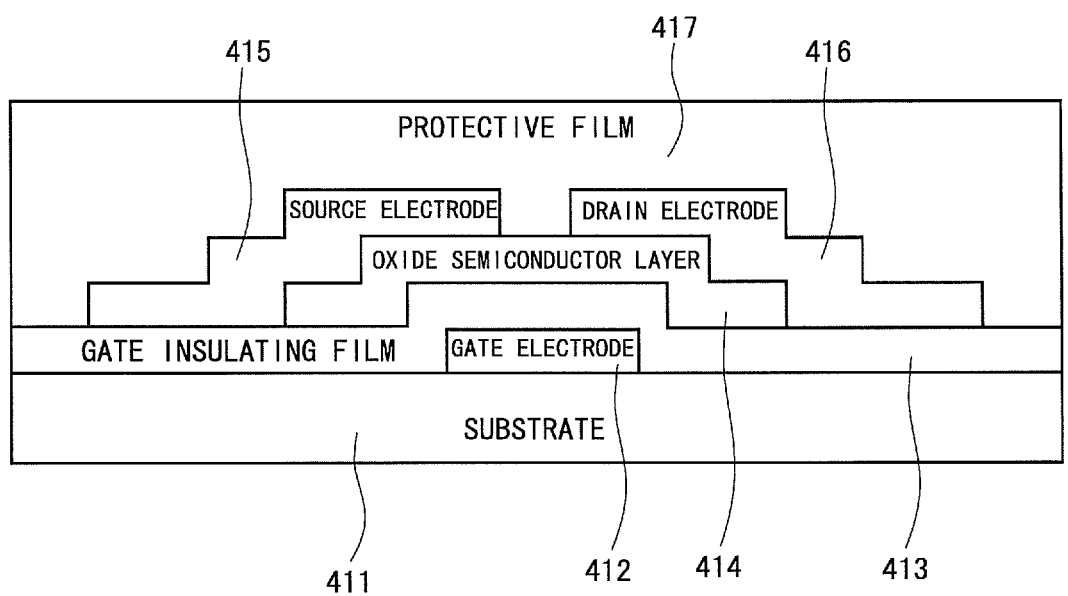
FIG. 4 is a diagram showing a configuration of a channel-etched TFT in the first embodiment.

FIG. 4 is a diagram showing a configuration of a channel-etched TFT. As shown in FIG. 4, the channel-etched TFT has a structure in which a gate electrode 412, a gate insulating film 413, an oxide semiconductor layer 414, and a source electrode 415 and a drain electrode 416 are stacked on top of each other on a substrate 411 and a protective film 417 is formed thereon. A portion of the oxide semiconductor layer 414 above the gate electrode 412 functions as a channel region. In the channel-etched TFT, an etch-stop layer is not formed in the channel region, and the bottom surfaces of edge portions on the channel side of the source electrode 415 and the drain electrode 416 are placed in contact with the top surface of the oxide semiconductor layer 414. The channel-etched TFT is formed by, for example, forming a conductive film for source and drain electrodes on the oxide semiconductor layer 414 and separating a source and a drain.

On the other hand, in an etch-stop TFT, an etch-stop layer is formed in a channel region. The bottom surfaces of edge portions on the channel side of a source electrode and a drain electrode are located, for example, on the etch-stop layer. The etch-stop TFT is formed by, for example, forming an etch-stop layer that covers a portion of an oxide semiconductor layer that serves as a channel region, and then forming a conductive film for source and drain electrodes on the oxide semiconductor layer and the etch-stop layer and separating a source and a drain.

Next, an oxide semiconductor will be described. An oxide semiconductor included in an oxide semiconductor layer may be an amorphous oxide semiconductor or may be a crystalline oxide semiconductor having a crystalline portion. Examples of crystalline oxide semiconductors include a polycrystalline oxide semiconductor, a microcrystalline oxide semiconductor, a crystalline oxide semiconductor with a c-axis aligned roughly perpendicularly to a layer surface, etc.

The oxide semiconductor layer may have a stacked layer structure of two or more layers. When the oxide semiconductor layer has a stacked layer structure, the oxide semiconductor layer may include an amorphous oxide semiconductor layer and a crystalline oxide semiconductor layer. Alternatively, the oxide semiconductor layer may include a plurality of crystalline oxide semiconductor layers of different crystal structures. Alternatively, the oxide semiconductor layer may include a plurality of amorphous oxide semiconductor layers. When the oxide semiconductor layer has a two-layer structure including an upper layer and a lower layer, it is preferred that the energy gap of an oxide semiconductor included in the upper layer be larger than that of an oxide semiconductor included in the lower layer. Note, however, that when the difference in energy gap between the layers is relatively small, the energy gap of the oxide semiconductor in the lower layer may be larger than that of the oxide semiconductor in the upper layer.

The materials, structures, and deposition methods for an amorphous oxide semiconductor and the above-described crystalline oxide semiconductors, the configuration of an oxide semiconductor layer having a stacked layer structure, etc., are described in, for example, Japanese Laid-Open Patent Publication No. 2014-7399. For reference, the entire disclosure content of Japanese Laid-Open Patent Publication No. 2014-7399 is incorporated in this specification.

The oxide semiconductor layer may contain, for example, at least one kind of metal element selected from indium (In), gallium (Ga), and zinc (Zn). In the present embodiment, the oxide semiconductor layer includes, for example, an In—Ga—Zn—O-based semiconductor (e.g., indium gallium zinc oxide). The In—Ga—Zn—O-based semiconductor is a ternary oxide of In, Ga, and Zn. The proportions (composition ratio) of In, Ga, and Zn are not particularly limited. For example, proportions such as In:Ga:Zn=2:2:1, In:Ga:Zn=1:1:1, or In:Ga:Zn=1:1:2 can be adopted. Such an oxide semiconductor layer can be formed from an oxide semiconductor film including an In—Ga—Zn—O-based semiconductor.

The In—Ga—Zn—O-based semiconductor may be amorphous or may be crystalline. For a crystalline In—Ga—Zn—O-based semiconductor, it is preferred to adopt a crystalline In—Ga—Zn—O-based semiconductor with a c-axis aligned roughly perpendicularly to a layer surface.

Note that the crystal structure of the crystalline In—Ga—Zn—O-based semiconductor is disclosed in, for example, Japanese Laid-Open Patent Publication No. 2014-7399, Japanese Laid-Open Patent Publication No. 2012-134475, and Japanese Laid-Open Patent Publication No. 2014-209727. For reference, the entire disclosure contents of Japanese Laid-Open Patent Publication No. 2012-134475 and Japanese Laid-Open Patent Publication No. 2014-209727 are incorporated in this specification. A TFT having an In—Ga—Zn—O-based semiconductor layer has high mobility (mobility over 20 times compared to an a-SiTFT) and a low leakage current (a leakage current less than 1/100 compared to an a-SiTFT). Hence, a TFT having an In—Ga—Zn—O-based semiconductor layer is suitably used as a driving TFT (e.g., a TFT in the above-described gate driver 320) and a pixel TFT (the above-described TFT 41).

The oxide semiconductor layer may include other oxide semiconductors instead of an In—Ga—Zn—O-based semiconductor. The oxide semiconductor layer may include, for example, an In—Sn—Zn—O-based semiconductor (e.g., $In_2O_3$—$SnO_2$—ZnO; InSnZnO). The In—Sn—Zn—O-based semiconductor is a ternary oxide of indium (In), tin (Sn), and zinc (Zn). Alternatively, the oxide semiconductor layer may include an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, cadmium oxide (CdO), an Mg—Zn—O-based semiconductor, an In—Ga—Sn—O-based semiconductor, an In—Ga—O-based semiconductor, a Zr—In—Zn—O-based semiconductor, an Hf—In—Zn—O-based semiconductor, etc. Here, Al represents aluminum, Ti represents titanium, Cd represents cadmium, Ge represents germanium, Pb represents lead, Mg represents magnesium, Zr represents zirconium, and Hf represents hafnium.

<1.3 Power Supply Circuit>

Figure 5:
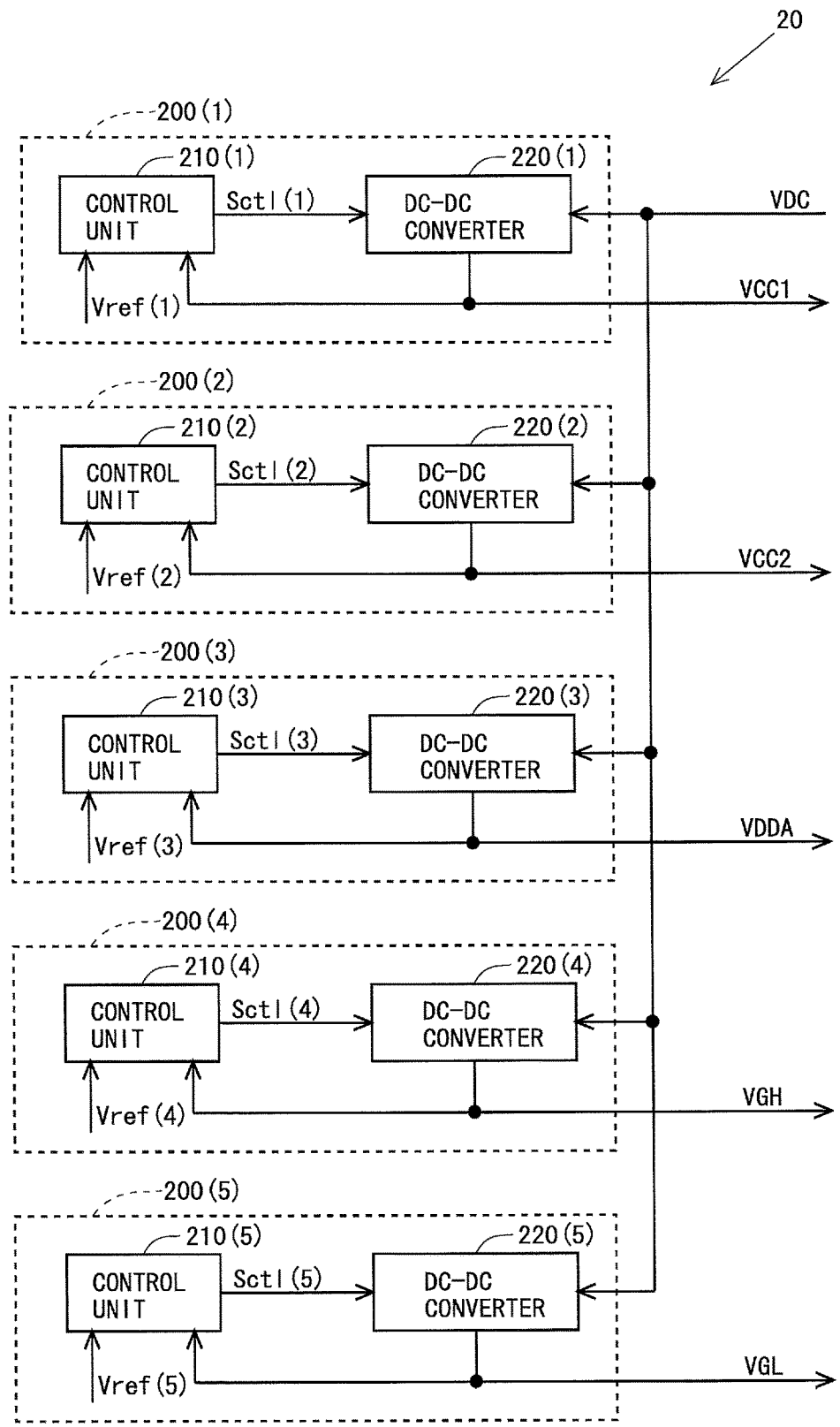
FIG. 5 is a block diagram showing a configuration of a power supply circuit common to all embodiments.

FIG. 5 is a block diagram showing a configuration of a power supply circuit 20 common to all embodiments. The power supply circuit 20 is composed of a first power supply voltage generating unit 200(1) that generates a timing controller logic power supply voltage VCC1 from a direct-current voltage VDC; a second power supply voltage generating unit 200(2) that generates a source driver logic power supply voltage VCC2 from the direct-current voltage VDC; a third power supply voltage generating unit 200(3) that generates a source driver analog power supply voltage VDDA from the direct-current voltage VDC; a fourth power supply voltage generating unit 200(4) that generates a gate-on power supply voltage VGH from the direct-current voltage VDC; and a fifth power supply voltage generating unit 200(5) that generates a gate-off power supply voltage VGL from the direct-current voltage VDC.

As shown in FIG. 5, each power supply voltage generating unit 200 is composed of a control unit 210 and a DC-DC converter 220. The control unit 210 compares a reference voltage Vref with a voltage that is fed back from the DC-DC converter 220, and outputs a switching control signal Sctl for controlling the on/off states of a switching element provided in the DC-DC converter 220. By the on/off states of the switching element in the DC-DC converter 220 controlled by the switching control signal Sctl, the DC-DC converter 220 generates a desired voltage from the direct-current voltage VDC. For example, a DC-DC converter 220(1) in the first power supply voltage generating unit 200(1) generates a timing controller logic power supply voltage VCC1.

Figure 6:
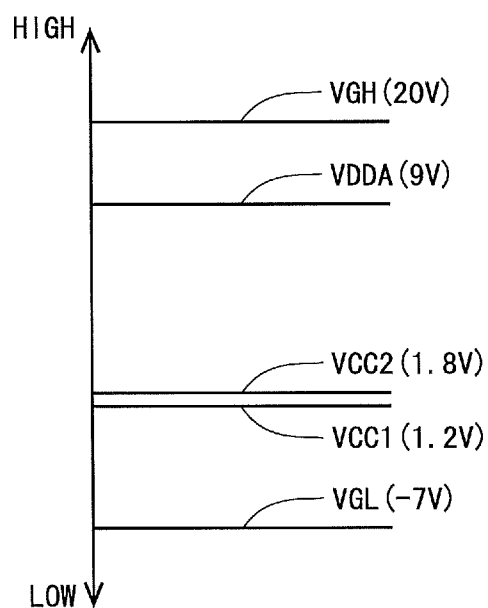
FIG. 6 is a diagram for describing a high-low relationship between a plurality of operation voltages used in the liquid crystal display device for a scanning period.

Now, with reference to FIG. 6, a high-low relationship between a plurality of operation voltages used in this liquid crystal display device for the scanning period will be described. The voltage value of the gate-on power supply voltage VGH is 20V. The voltage value of the source driver analog power supply voltage VDDA is 9 V. The voltage value of the source driver logic power supply voltage VCC2 is 1.8 V. The voltage value of the timing controller logic power supply voltage VCC1 is 1.2 V. The voltage value of the gate-off power supply voltage VGL is −7 V. These plurality of operation voltages are arranged in descending order of their voltage values as follows: "the gate-on power supply voltage VGH, the source driver analog power supply voltage VDDA, the source driver logic power supply voltage VCC2, the timing controller logic power supply voltage VCC1, and the gate-off power supply voltage VGL".

Next, a configuration of the DC-DC converter 220 will be described. Although various configurations are known for the configuration of the DC-DC converter 220, here, an exemplary configuration of a step-up type and an exemplary configuration of a step-down type will be described. Note, however, that the present invention is not limited to these configurations.

Figure 7:
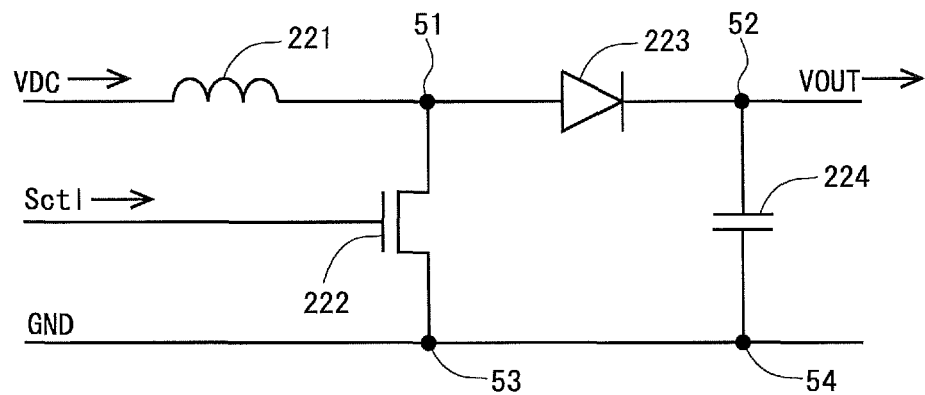
FIG. 7 is a circuit diagram showing an exemplary configuration of a DC-DC converter (step-up type) in the power supply circuit.

FIG. 7 is a circuit diagram showing an exemplary configuration of a step-up type DC-DC converter 220. The DC-DC converter 220 shown in FIG. 7 is composed of a coil 221, a switching element 222, a diode 223, and a capacitor 224. The coil 221 has one end to which a direct-current voltage VDC is provided, and the other end connected to a node 51. The switching element 222 is provided between the node 51 and a node 53, and has a control terminal to which a switching control signal Sctl is provided. The diode 223 has an anode connected to the node 51 and a cathode connected to a node 52. The capacitor 224 is provided between the node 52 and a node 54.

In a configuration such as that described above, when the switching element 222 goes into an on state, a current flows between the node 51 and the node 53 and energy is accumulated in the coil 221. At this time, the diode 223 is in an off state. When the switching element 222 goes into an off state, a counter-electromotive force occurs and the voltage at the node 51 becomes higher than the direct-current voltage VDC. By this, the diode 223 goes into an on state and an output voltage VOUT higher than the direct-current voltage VDC is outputted from the DC-DC converter 220.

Figure 8:
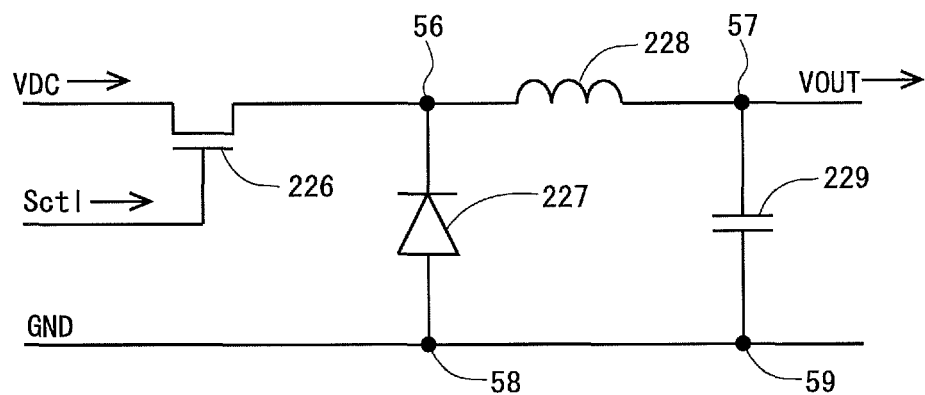
FIG. 8 is a circuit diagram showing an exemplary configuration of a DC-DC converter (step-down type) in the power supply circuit.

FIG. 8 is a circuit diagram showing an exemplary configuration of a step-down type DC-DC converter 220. The DC-DC converter 220 shown in FIG. 8 is composed of a switching element 226, a diode 227, a coil 228, and a capacitor 229. The switching element 226 is provided between an input terminal for a direct-current voltage VDC and a node 56, and has a control terminal to which a switching control signal Sctl is provided. The diode 227 has an anode connected to a node 58 and a cathode connected to the node 56. The coil 228 is provided between the node 56 and a node 57. The capacitor 229 is provided between the node 57 and a node 59.

In a configuration such as that described above, when the switching element 226 goes into an on state, a current flows from the input side to the output side, and energy is accumulated in the coil 228. At this time, the diode 227 is in an off state. When the switching element 226 goes into an off state, since the coil 228 tries to maintain the last current value, the diode 227 goes into an on state. By this, the voltage at the node 56 decreases and thus an output voltage VOUT lower than the direct-current voltage VDC is outputted from the DC-DC converter 220.

Figure 9:
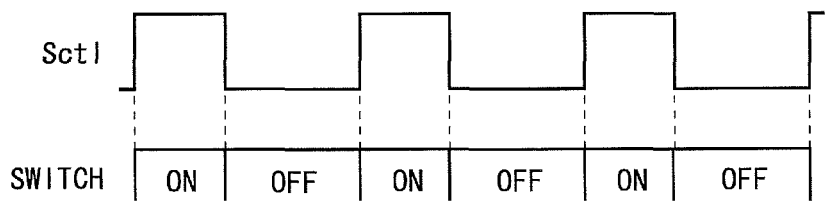
FIG. 9 is a diagram for describing the control of a switch in the DC-DC converter.

In the DC-DC converters 220 such as those described above, as shown in FIG. 9, the on/off states of a switch (the switching element 222 in FIG. 7 and the switching element 226 in FIG. 8) are controlled by the switching control signal Sctl. By this, each DC-DC converter 220 generates a desired voltage.

Figure 10:
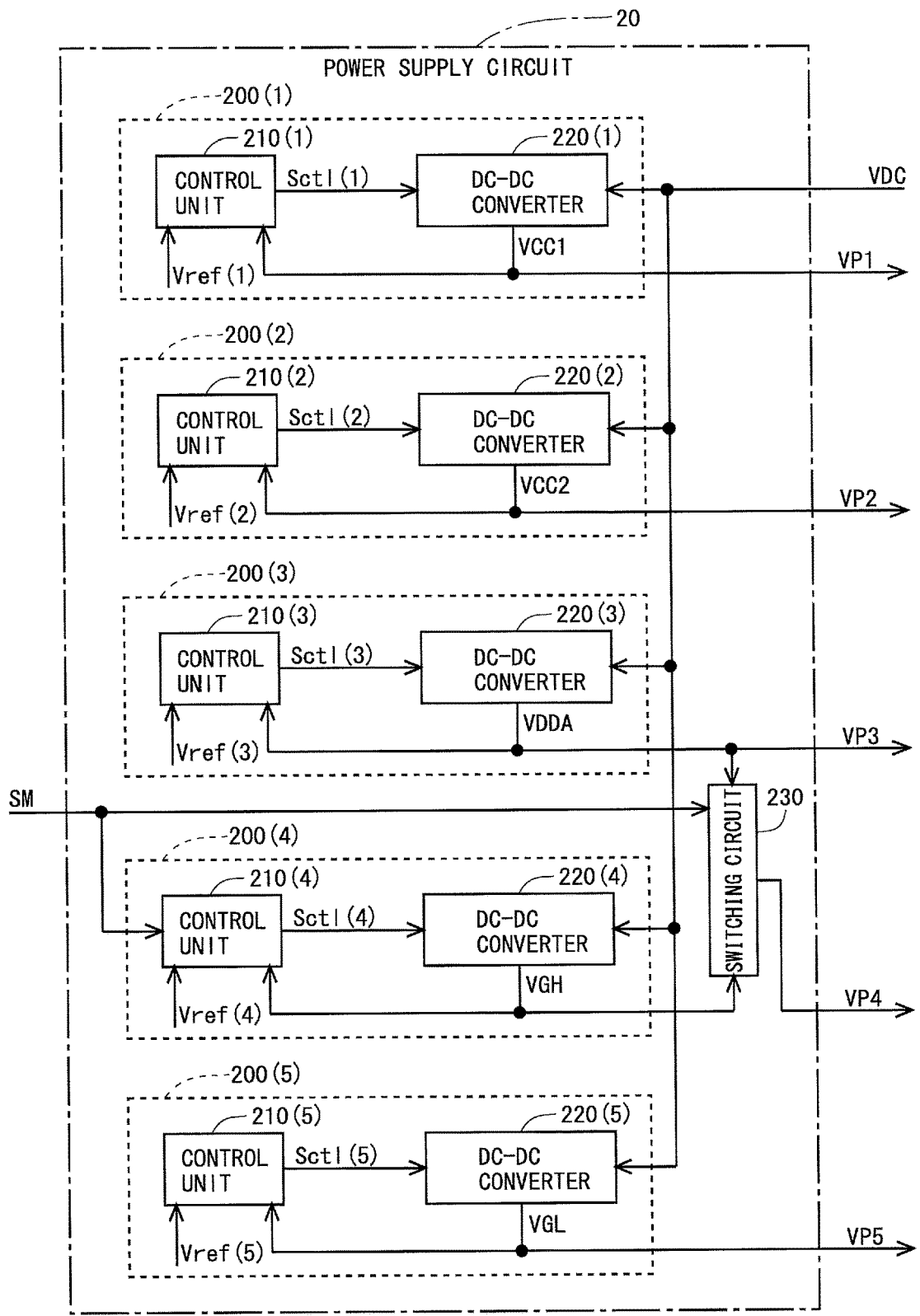
FIG. 10 is a block diagram showing a configuration of a power supply circuit in the first embodiment.

FIG. 10 is a block diagram showing a configuration of a power supply circuit 20 in the present embodiment. The power supply circuit 20 in the present embodiment is provided with a switching circuit 230 in addition to the first to fifth power supply voltage generating units 200(1) to 200(5). In such a configuration, a control signal SM is provided to the switching circuit 230 and a control unit 210(4) in the fourth power supply voltage generating unit 200(4). The switching circuit 230 switches a voltage to be outputted as a fourth voltage VP4 between a gate-on power supply voltage VGH generated by the fourth power supply voltage generating unit 200(4) and a source driver analog power supply voltage VDDA generated by the third power supply voltage generating unit 200(3), based on the control signal SM.

Figure 11:
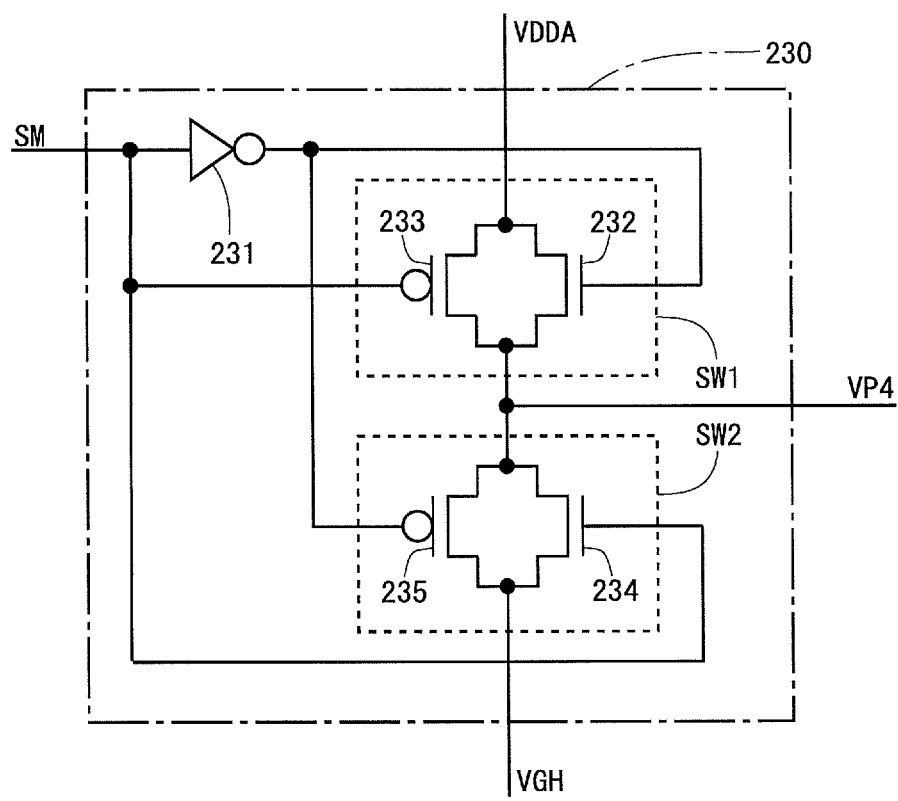
FIG. 11 is a circuit diagram showing an exemplary configuration of a switching circuit in the power supply circuit in the first embodiment.

FIG. 11 is a circuit diagram showing an exemplary configuration of the switching circuit 230 in the power supply circuit 20. The switching circuit 230 is composed of an inverter 231; a first CMOS switch SW1 including an N-type TFT 232 and a P-type TFT 233; and a second CMOS switch SW2 including an N-type TFT 234 and a P-type TFT 235. The inverter 231 has an input terminal to which a control signal SM is provided, and an output terminal connected to a gate electrode of the N-type TFT 232 and a gate electrode of the P-type TFT 235. A source driver analog power supply voltage VDDA is provided to an input terminal of the first CMOS switch SW1, and a gate-on power supply voltage VGH is provided to an input terminal of the second CMOS switch SW2.

In a configuration such as that described above, when the control signal SM is at a high level, the first CMOS switch SW1 goes into an off state and the second CMOS switch SW2 goes into an on state. Therefore, the gate-on power supply voltage VGH is outputted as a fourth voltage VP4 from the switching circuit 230. On the other hand, when the control signal SM is at a low level, the first CMOS switch SW1 goes into an on state and the second CMOS switch SW2 goes into an off state. Therefore, the source driver analog power supply voltage VDDA is outputted as a fourth voltage VP4 from the switching circuit 230.

<1.4 Voltage Control Method>

Figure 12:
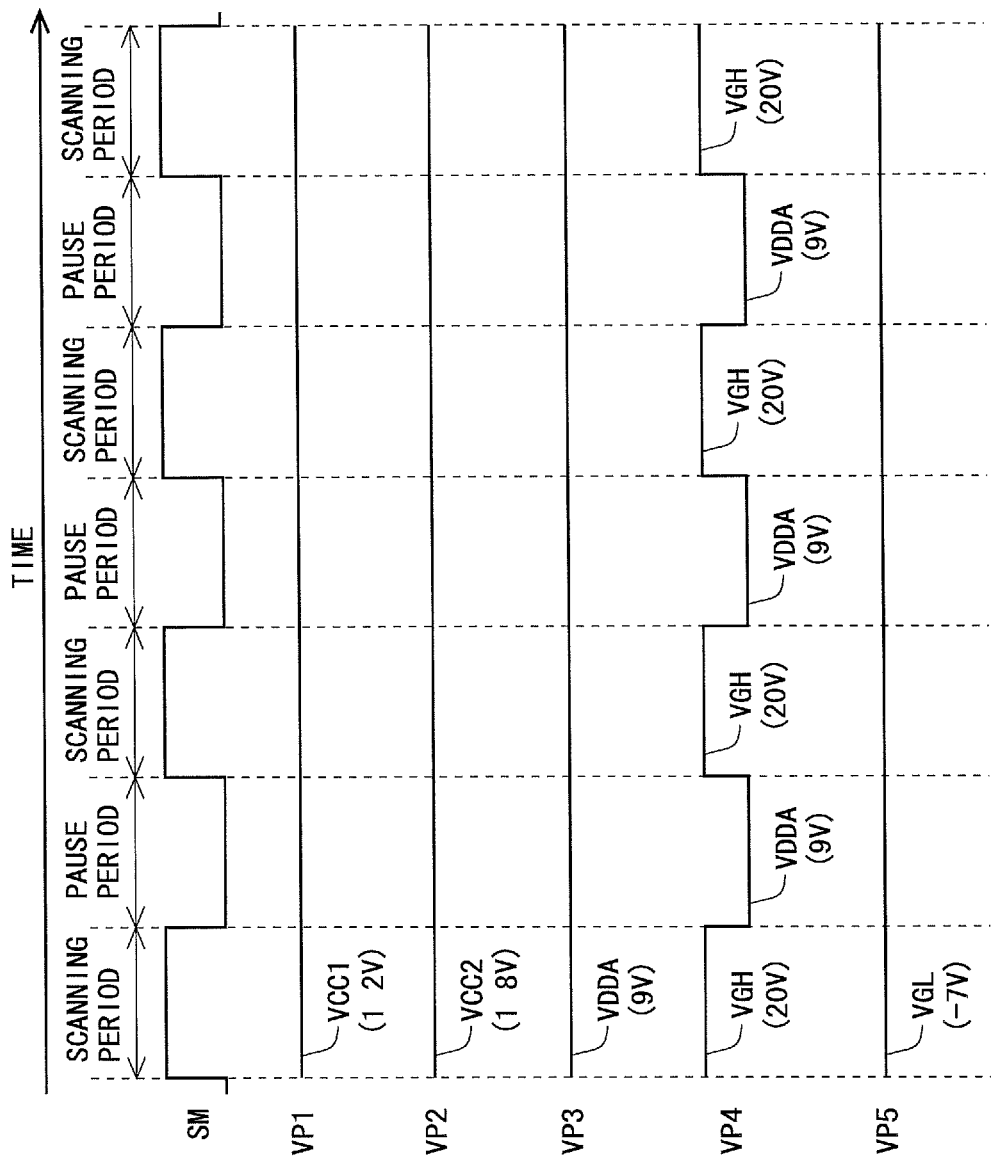
FIG. 12 is a timing chart for describing a voltage control method in the first embodiment.

Next, with reference to FIG. 12, a voltage control method in the present embodiment will be described. During the scanning period, a high-level control signal SM is provided to the power supply circuit 20 from the timing controller 310. By this, during the scanning period, operation voltages are supplied to the display driving unit 30 from the power supply circuit 20 as follows. A timing controller logic power supply voltage VCC1 of 1.2 V is supplied as a first voltage VP1, a source driver logic power supply voltage VCC2 of 1.8 V is supplied as a second voltage VP2, a source driver analog power supply voltage VDDA of 9 V is supplied as a third voltage VP3, a gate-on power supply voltage VGH of 20 V is supplied as a fourth voltage VP4, and a gate-off power supply voltage VGL of −7 V is supplied as a fifth voltage VP5.

During the pause period, a low-level control signal SM is provided to the power supply circuit 20 from the timing controller 310. By this, during the pause period, operation voltages are supplied to the display driving unit 30 from the power supply circuit 20 as follows. A timing controller logic power supply voltage VCC1 of 1.2 V is supplied as the first voltage VP1, a source driver logic power supply voltage VCC2 of 1.8 V is supplied as the second voltage VP2, a source driver analog power supply voltage VDDA of 9 V is supplied as the third voltage VP3, a source driver analog power supply voltage VDDA of 9 V is supplied as the fourth voltage VP4, and a gate-off power supply voltage VGL of −7 V is supplied as the fifth voltage VP5.

As described above, in the present embodiment, during the scanning period, a gate-on power supply voltage VGH of 20 V is supplied as a fourth voltage VP4 to the gate driver 320 from the power supply circuit 20; on the other hand, during the pause period, a source driver analog power supply voltage VDDA of 9 V is supplied as the fourth voltage VP4 to the gate driver 320 from the power supply circuit 20. In other words, during the pause period, a source driver analog power supply voltage VDDA of 9 V is supplied to the gate driver 320, instead of the gate-on power supply voltage VGH of 20 V. Note that it is preferred that the generation of a gate-on power supply voltage VGH by the fourth power supply voltage generating unit 200(4) be stopped during the pause period.

<1.5 Effect>

Figure 13:
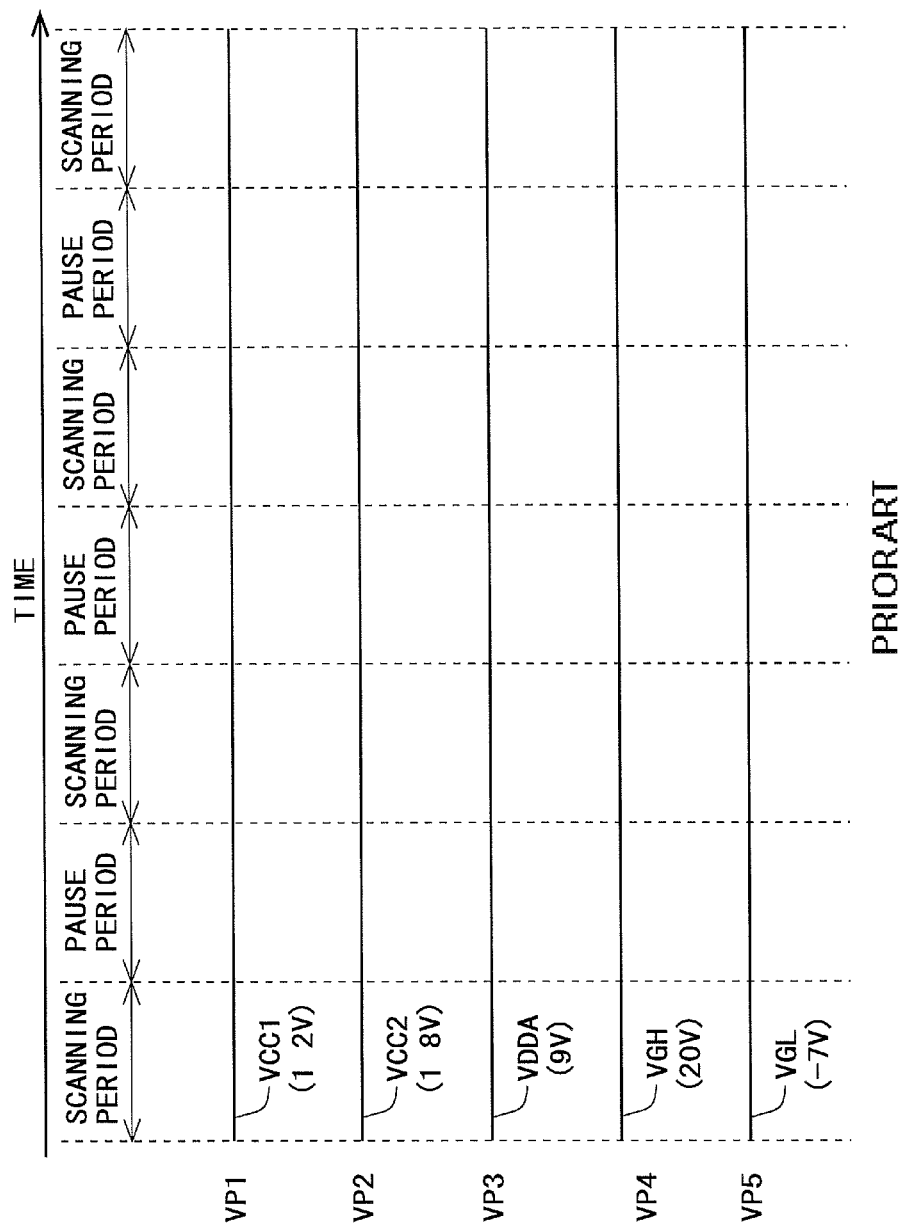
FIG. 13 is a diagram for describing the supply of operation voltages to a display driving unit from a power supply circuit in a conventional liquid crystal display device adopting pause driving.

In a conventional liquid crystal display device adopting pause driving, the same voltages (operation voltages) are supplied to the display driving unit 30 from the power supply circuit 20 for the scanning period and the pause period (see FIG. 13). On the other hand, according to the present embodiment, as shown in FIG. 12, the fourth voltage VP4 supplied to the gate driver 320 in the display driving unit 30 from the power supply circuit 20 differs between the scanning period and the pause period. In other words, as described above, during the pause period, a source driver analog power supply voltage VDDA of 9 V is supplied to the gate driver 320, instead of the gate-on power supply voltage VGH of 20 V. By this, power consumption is reduced. Meanwhile, in a liquid crystal display device, despite the fact the power is turned off, display may not be cleared immediately and an image such as an afterimage may remain. The reason therefor is because when power to the device is turned off, a discharge path for charge held in the pixel capacitance 47 is interrupted and remaining charge is accumulated in the pixel formation portion 4. In addition, when power to the device is turned on with the remaining charge accumulated in the pixel formation portion 4, degradation in display quality occurs, such as the occurrence of flicker resulting from an impurity imbalance due to the remaining charge. Hence, upon power-off, all gate bus lines GL are brought into a selected state and a voltage corresponding to black display is applied to the source bus lines SL, by which remaining charge is removed. Regarding this, even when a voltage applied to the gate bus lines GL is the source driver analog power supply voltage VDDA, the voltage between the gate and source of the TFT 41 in the pixel formation portion 4 reaches a sufficient magnitude, and thus, remaining charge can be removed upon power-off. By the above, according to the present embodiment, a display device adopting pause driving can further reduce power consumption over the conventional display device.

In addition, in the present embodiment, for the TFT 41 in the pixel formation portion 4, an oxide TFT (a thin film transistor having an oxide semiconductor layer) is adopted.

Hence, a voltage written into the pixel capacitance 47 is held for a long period of time. Therefore, the frequency of refreshing (screen update) can be reduced without degrading display quality. By reducing the frequency of refreshing upon displaying a still image, power consumption can be significantly reduced without causing a problem concerning display. Particularly, by adopting a TFT having an oxide semiconductor layer containing indium gallium zinc oxide, the effect of a reduction in power consumption can be securely obtained.

2. Second Embodiment

<2.1 Configuration>

Figure 14:
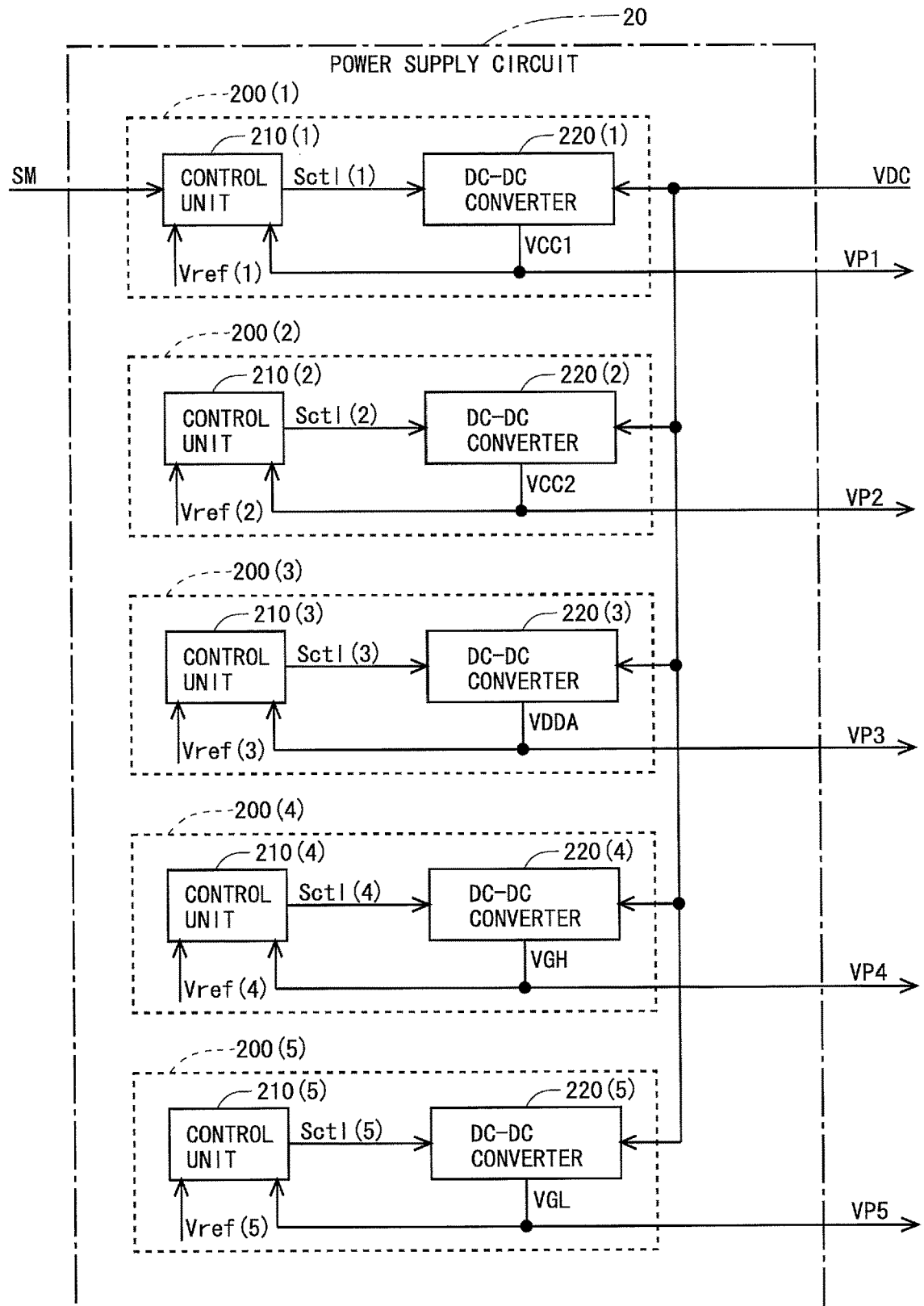
FIG. 14 is a block diagram showing a configuration of a power supply circuit in a second embodiment of the present invention.
Figure 15:
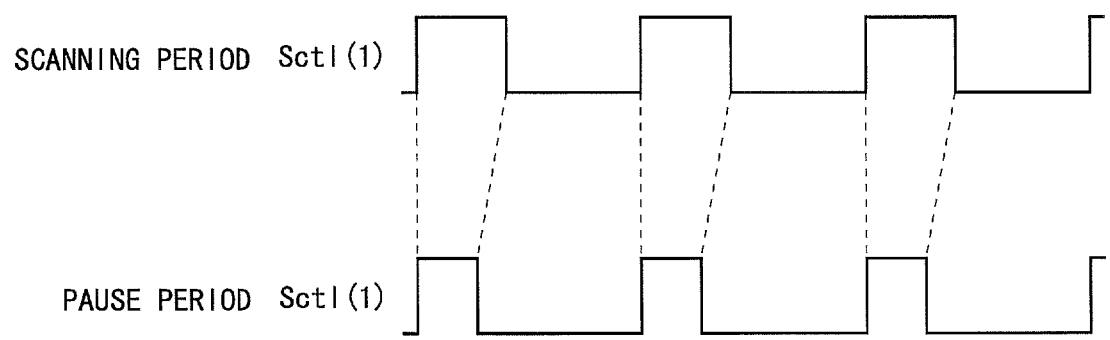
FIG. 15 is a diagram for describing the adjustment of on-duty in the second embodiment.

A second embodiment of the present invention will be described. Note that description of the same things as in the first embodiment is omitted and differences from the first embodiment will be described. FIG. 14 is a block diagram showing a configuration of a power supply circuit 20 in the present embodiment. Unlike the first embodiment, the power supply circuit 20 in the present embodiment is not provided with a switching circuit. A control signal SM is provided to a control unit 210(1) in a first power supply voltage generating unit 200(1). The control unit 210(1) controls the on-duty of a switching control signal Sctl(1) based on the control signal SM. Specifically, when the control signal SM is at a high level, the on-duty of the switching control signal Sctl(1) is adjusted such that the voltage value of a timing controller logic power supply voltage VCC1 outputted from a DC-DC converter 220(1) is 1.2 V. On the other hand, when the control signal SM is at a low level, the on-duty of the switching control signal Sctl(1) is adjusted such that the voltage value of the timing controller logic power supply voltage VCC1 outputted from the DC-DC converter 220(1) is 1.0 V. For example, as shown in FIG. 15, the on-duty of the switching control signal Sctl(1) is made smaller during the pause period than during the scanning period.

<2.2 Voltage Control Method>

Next, with reference to FIG. 16, a voltage control method in the present embodiment will be described. During the scanning period, a high-level control signal SM is provided to the power supply circuit 20 from the timing controller 310. By this, during the scanning period, the supply of operation voltages to the display driving unit 30 from the power supply circuit 20 is performed in the same manner as in the first embodiment. During the pause period, a low-level control signal SM is provided to the power supply circuit 20 from the timing controller 310. By this, during the pause period, operation voltages are supplied to the display driving unit 30 from the power supply circuit 20 as follows. A timing controller logic power supply voltage VCC1 of 1.0 V is supplied as a first voltage VP1, a source driver logic power supply voltage VCC2 of 1.8 V is supplied as a second voltage VP2, a source driver analog power supply voltage VDDA of 9 V is supplied as a third voltage VP3, a gate-on power supply voltage VGH of 20 V is supplied as a fourth voltage VP4, and a gate-off power supply voltage VGL of −7 V is supplied as a fifth voltage VP5.

As described above, in the present embodiment, during the scanning period, a timing controller logic power supply voltage VCC1 of 1.2 V is supplied as a first voltage VP1 to the timing controller 310 from the power supply circuit 20; on the other hand, during the pause period, a timing controller logic power supply voltage VCC1 of 1.0 V is supplied as the first voltage VP1 to the timing controller 310 from the power supply circuit 20. In other words, the voltage value of the timing controller logic power supply voltage VCC1 supplied to the timing controller 310 from the power supply circuit 20 is made smaller during the pause period than during the scanning period. Note that the reduction in the voltage value of the timing controller logic power supply voltage VCC1 is performed in a range in which the reduction does not affect the operation of the timing controller 310 during the pause period.

<2.3 Effect>

Figure 16:
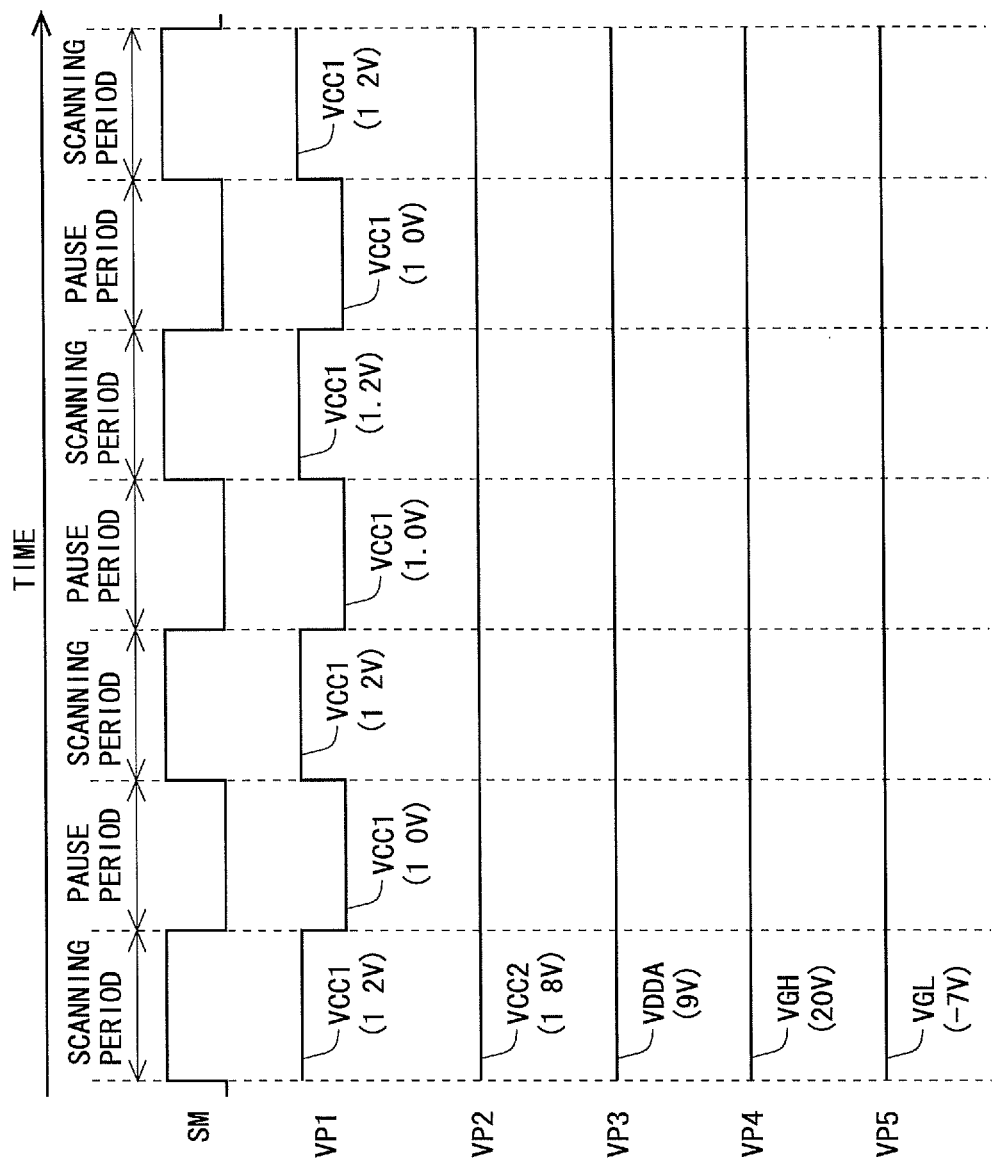
FIG. 16 is a timing chart for describing a voltage control method in the second embodiment.

According to the present embodiment, as shown in FIG. 16, the voltage value of the timing controller logic power supply voltage VCC1 supplied to the timing controller 310 from the power supply circuit 20 is made smaller during the pause period than during the scanning period. By this, as in the first embodiment, a display device adopting pause driving can further reduce power consumption over the conventional display device.

3. Third Embodiment

<3.1 Configuration>

Figure 17:
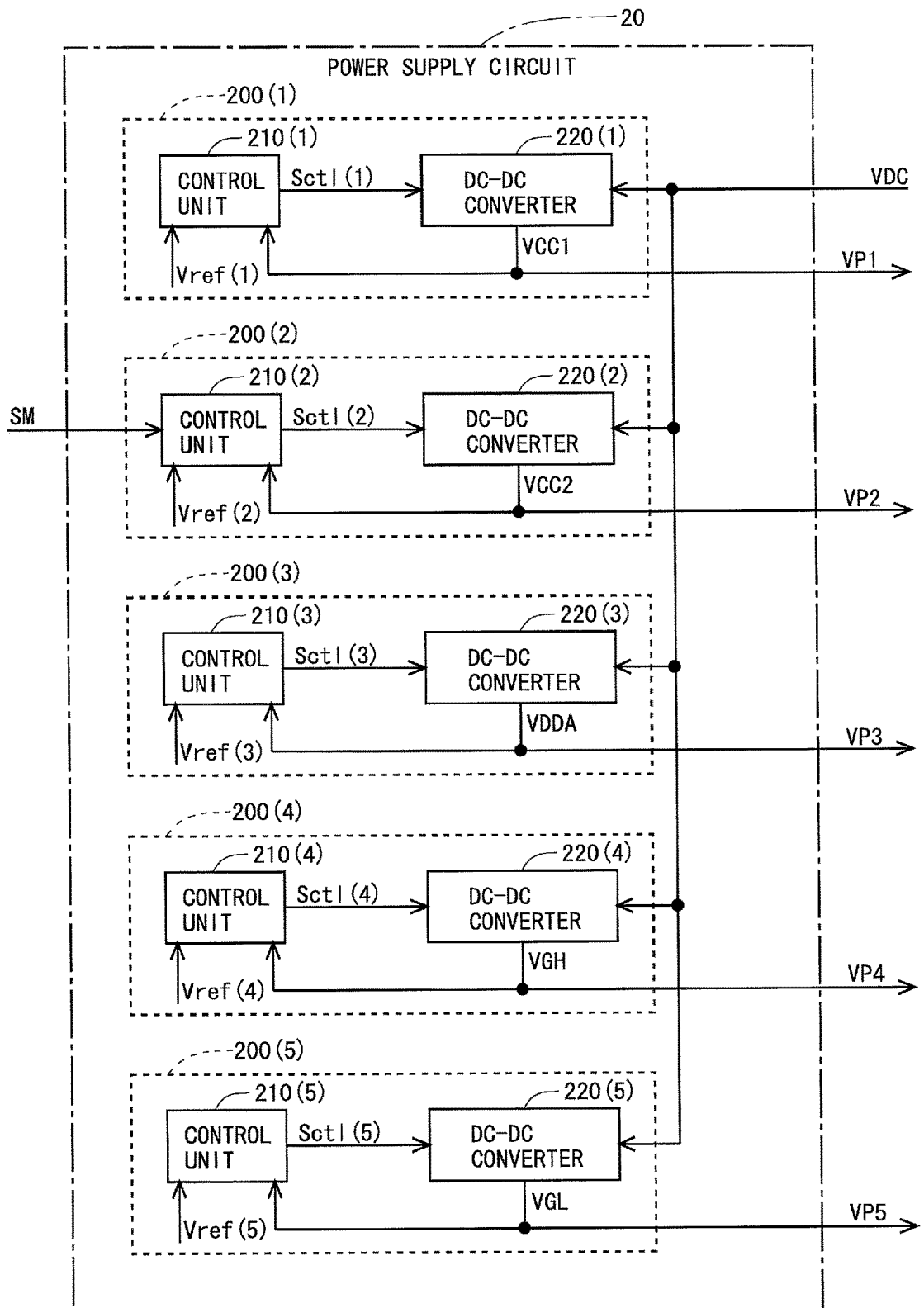
FIG. 17 is a block diagram showing a configuration of a power supply circuit in a third embodiment of the present invention.

A third embodiment of the present invention will be described. Note that description of the same things as in the first embodiment is omitted and differences from the first embodiment will be described. FIG. 17 is a block diagram showing a configuration of a power supply circuit 20 in the present embodiment. Unlike the first embodiment, the power supply circuit 20 in the present embodiment is not provided with a switching circuit. A control signal SM is provided to a control unit 210(2) in a second power supply voltage generating unit 200(2). The control unit 210(2) controls the on-duty of a switching control signal Sctl (2) based on the control signal SM. Specifically, when the control signal SM is at a high level, the on-duty of the switching control signal Sctl (2) is adjusted such that the voltage value of a source driver logic power supply voltage VCC2 outputted from a DC-DC converter 220(2) is 1.8 V. On the other hand, when the control signal SM is at a low level, the on-duty of the switching control signal Sctl (2) is adjusted such that the voltage value of the source driver logic power supply voltage VCC2 outputted from the DC-DC converter 220(2) is 1.6 V. For example, as in the second embodiment, the on-duty of the switching control signal Sctl (2) is made smaller during the pause period than during the scanning period.

<3.2 Voltage Control Method>

Next, with reference to FIG. 18, a voltage control method in the present embodiment will be described. During the scanning period, a high-level control signal SM is provided to the power supply circuit 20 from the timing controller 310. By this, during the scanning period, the supply of operation voltages to the display driving unit 30 from the power supply circuit 20 is performed in the same manner as in the first embodiment. During the pause period, a low-level control signal SM is provided to the power supply circuit 20 from the timing controller 310. By this, during the pause period, operation voltages are supplied to the display driving unit 30 from the power supply circuit 20 as follows. A timing controller logic power supply voltage VCC1 of 1.2 V is supplied as a first voltage VP1, a source driver logic power supply voltage VCC2 of 1.6 V is supplied as a second voltage VP2, a source driver analog power supply voltage VDDA of 9 V is supplied as a third voltage VP3, a gate-on power supply voltage VGH of 20 V is supplied as a fourth voltage VP4, and a gate-off power supply voltage VGL of −7 V is supplied as a fifth voltage VP5.

As described above, in the present embodiment, during the scanning period, a source driver logic power supply voltage VCC2 of 1.8 V is supplied as a second voltage VP2 to the source driver 330 from the power supply circuit 20; on the other hand, during the pause period, a source driver logic power supply voltage VCC2 of 1.6 V is supplied as the second voltage VP2 to the source driver 330 from the power supply circuit 20. In other words, the voltage value of the source driver logic power supply voltage VCC2 supplied to the source driver 330 from the power supply circuit 20 is made smaller during the pause period than during the scanning period. Note that the reduction in the voltage value of the source driver logic power supply voltage VCC2 is performed in a range in which the reduction does not affect the operation of the source driver 330 during the pause period.

<3.3 Effect>

Figure 18:
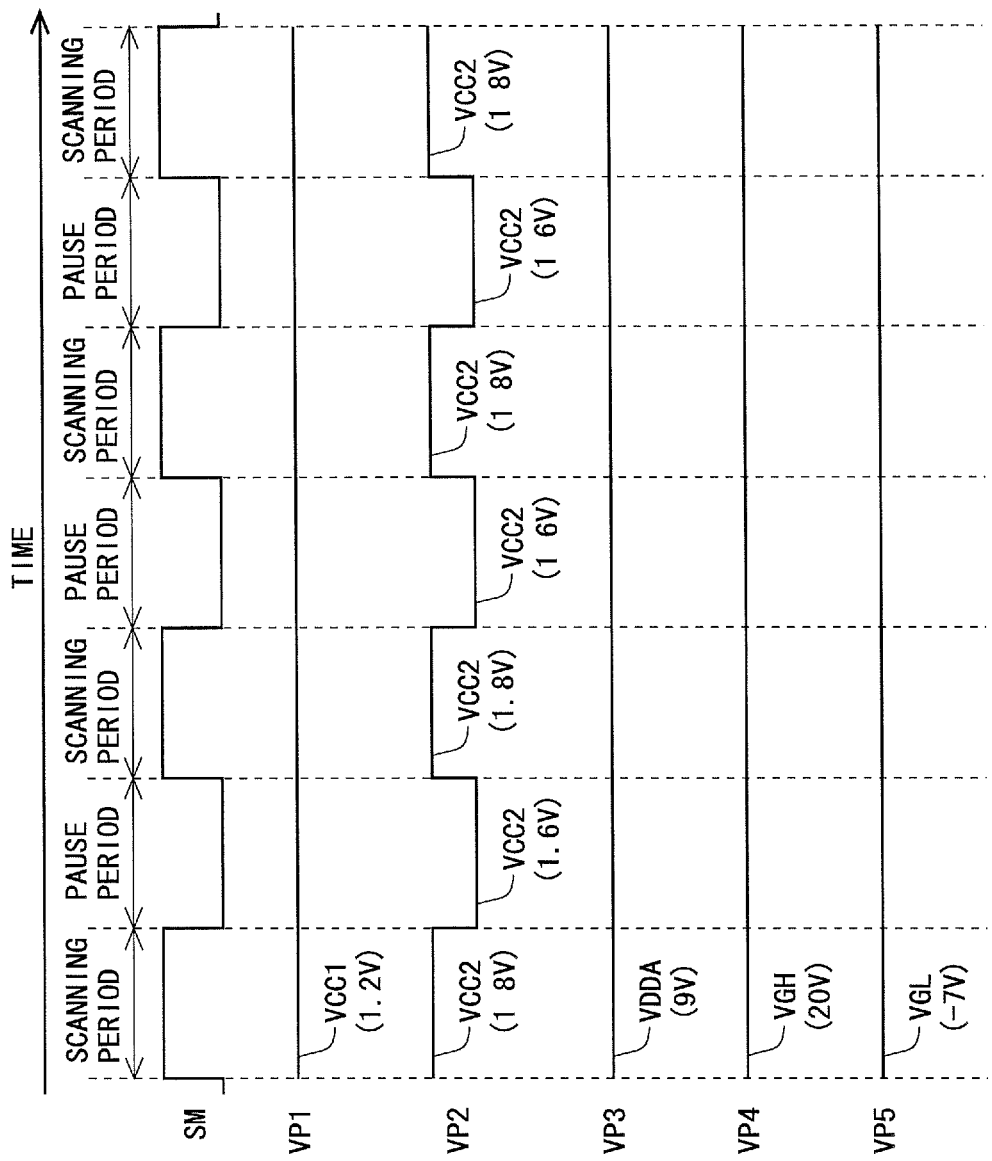
FIG. 18 is a timing chart for describing a voltage control method in the third embodiment.

According to the present embodiment, as shown in FIG. 18, the voltage value of the source driver logic power supply voltage VCC2 supplied to the source driver 330 from the power supply circuit 20 is made smaller during the pause period than during the scanning period. By this, as in the first embodiment, a display device adopting pause driving can further reduce power consumption over the conventional display device.

4. Fourth Embodiment

<4.1 Configuration>

Figure 19:
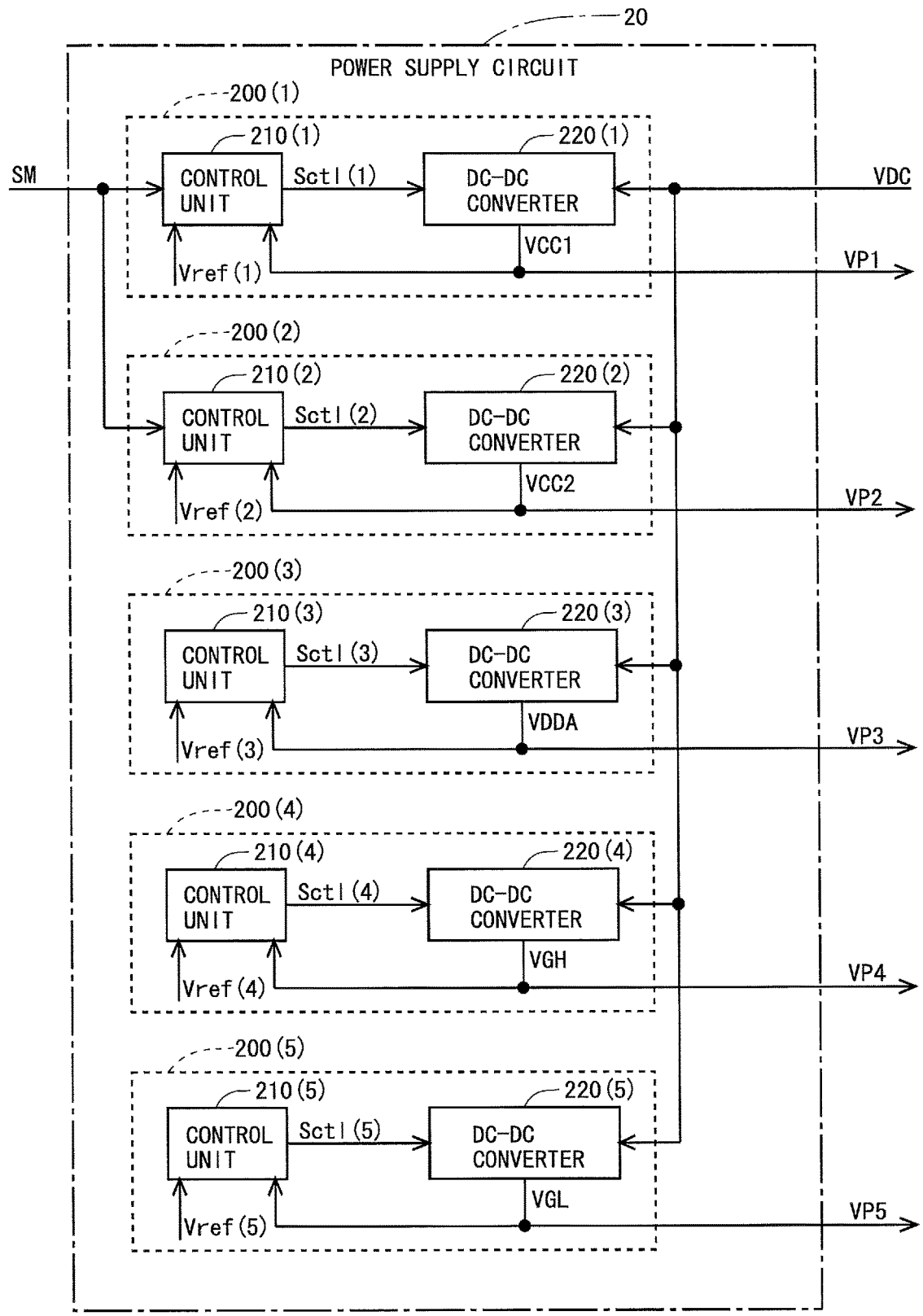
FIG. 19 is a block diagram showing a configuration of a power supply circuit in a fourth embodiment of the present invention.

A fourth embodiment of the present invention will be described. Note that description of the same things as in the first embodiment is omitted and differences from the first embodiment will be described. FIG. 19 is a block diagram showing a configuration of a power supply circuit 20 in the present embodiment. Unlike the first embodiment, the power supply circuit 20 in the present embodiment is not provided with a switching circuit. A control signal SM is provided to a control unit 210(1) in a first power supply voltage generating unit 200(1) and a control unit 210(2) in a second power supply voltage generating unit 200(2). The control unit 210(1) controls, as in the second embodiment, the on-duty of a switching control signal Sctl(1) based on the control signal SM. The control unit 210(2) controls, as in the third embodiment, the on-duty of a switching control signal Sctl(2) based on the control signal SM.

<4.2 Voltage Control Method>

Figure 20:
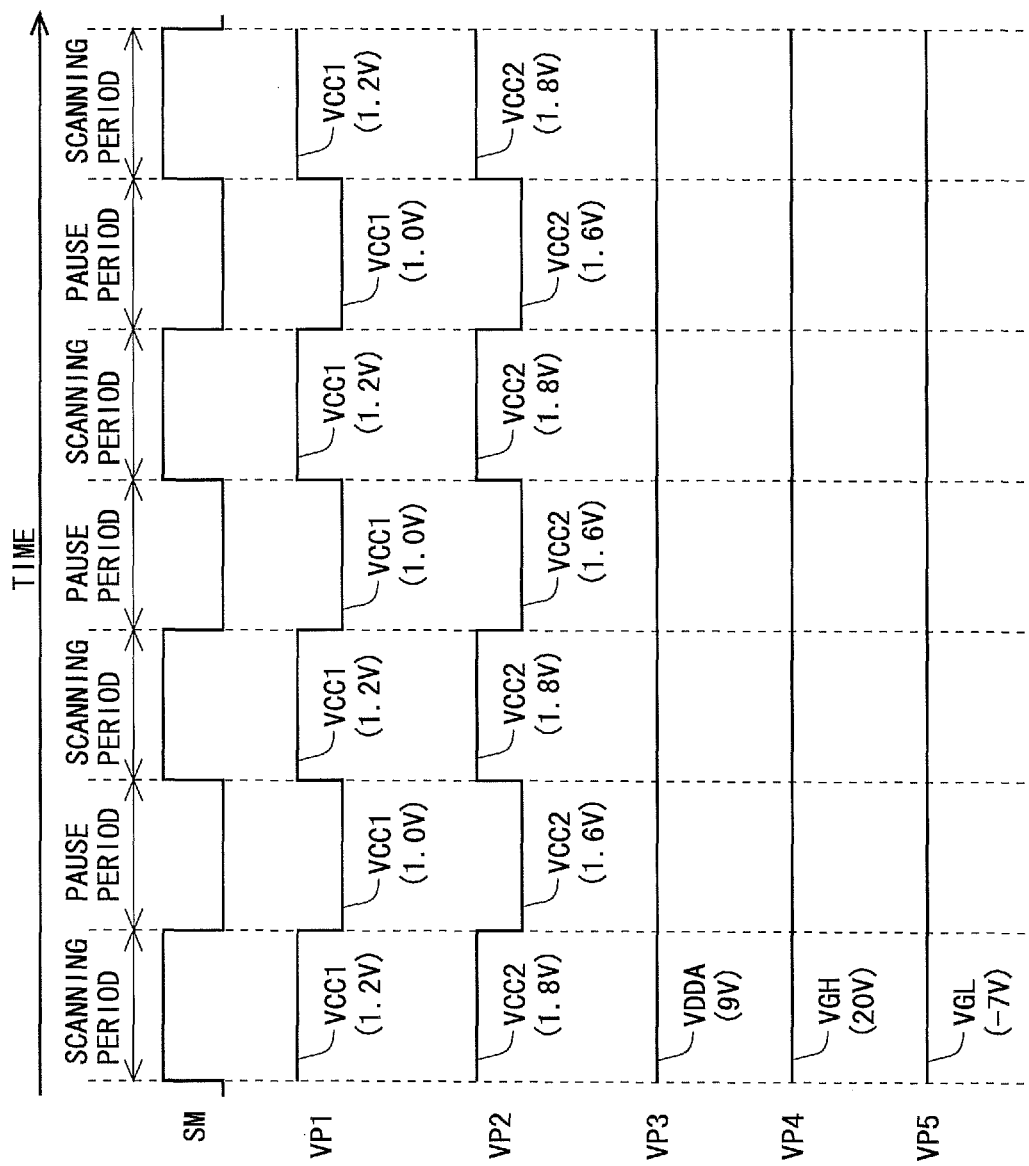
FIG. 20 is a timing chart for describing a voltage control method in the fourth embodiment.

Next, with reference to FIG. 20, a voltage control method in the present embodiment will be described. During the scanning period, a high-level control signal SM is provided to the power supply circuit 20 from the timing controller 310. By this, during the scanning period, the supply of operation voltages to the display driving unit 30 from the power supply circuit 20 is performed in the same manner as in the first embodiment. During the pause period, a low-level control signal SM is provided to the power supply circuit 20 from the timing controller 310. By this, during the pause period, operation voltages are supplied to the display driving unit 30 from the power supply circuit 20 as follows. A timing controller logic power supply voltage VCC1 of 1.0 V is supplied as a first voltage VP1, a source driver logic power supply voltage VCC2 of 1.6 V is supplied as a second voltage VP2, a source driver analog power supply voltage VDDA of 9 V is supplied as a third voltage VP3, a gate-on power supply voltage VGH of 20 V is supplied as a fourth voltage VP4, and a gate-off power supply voltage VGL of −7 V is supplied as a fifth voltage VP5.

As described above, in the present embodiment, as in the second embodiment, the voltage value of the timing controller logic power supply voltage VCC1 supplied to the timing controller 310 from the power supply circuit 20 is made smaller during the pause period than during the scanning period. Note that the reduction in the voltage value of the timing controller logic power supply voltage VCC1 is performed in a range in which the reduction does not affect the operation of the timing controller 310 during the pause period. In addition, in the present embodiment, as in the third embodiment, the voltage value of the source driver logic power supply voltage VCC2 supplied to the source driver 330 from the power supply circuit 20 is made smaller during the pause period than during the scanning period. Note that the reduction in the voltage value of the source driver logic power supply voltage VCC2 is performed in a range in which the reduction does not affect the operation of the source driver 330 during the pause period.

<4.3 Effect>

According to the present embodiment, the voltage value of the timing controller logic power supply voltage VCC1 supplied to the timing controller 310 from the power supply circuit 20 is made smaller during the pause period than during the scanning period. In addition, the voltage value of the source driver logic power supply voltage VCC2 supplied to the source driver 330 from the power supply circuit 20 is made smaller during the pause period than during the scanning period. By the above, as in the first embodiment, a display device adopting pause driving can further reduce power consumption over the conventional display device.

5. Fifth Embodiment

<5.1 Configuration>

Figure 21:
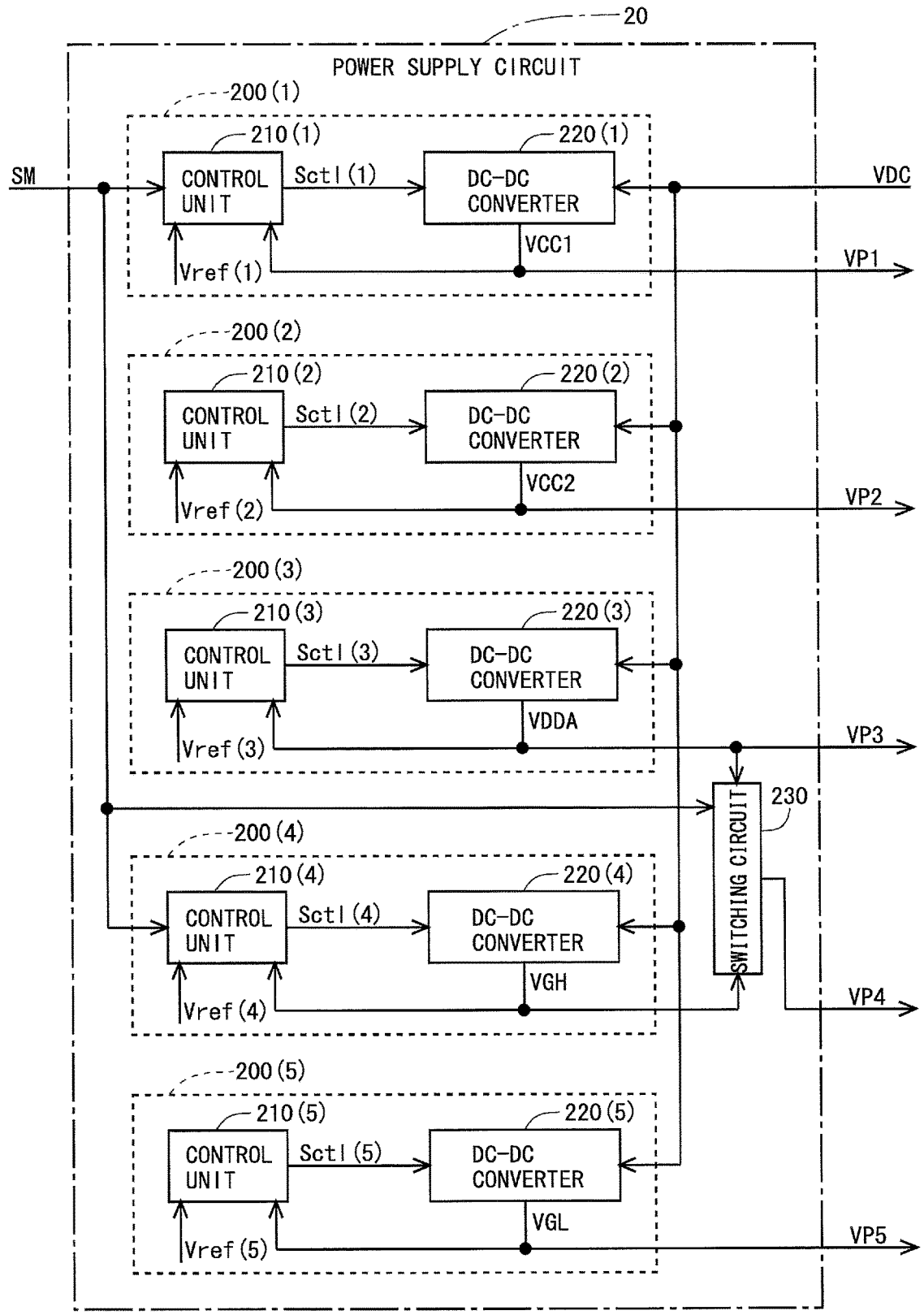
FIG. 21 is a block diagram showing a configuration of a power supply circuit in a fifth embodiment of the present invention.

A fifth embodiment of the present invention will be described. Note that description of the same things as in the first embodiment is omitted and differences from the first embodiment will be described. FIG. 21 is a block diagram showing a configuration of a power supply circuit 20 in the present embodiment. The power supply circuit 20 in the present embodiment is provided with a switching circuit 230 having the same configuration as that in the first embodiment. A control signal SM is provided to the switching circuit 230, a control unit 210(4) in a fourth power supply voltage generating unit 200(4), and a control unit 210(1) in a first power supply voltage generating unit 200(1).

<5.2 Voltage Control Method>

Figure 22:
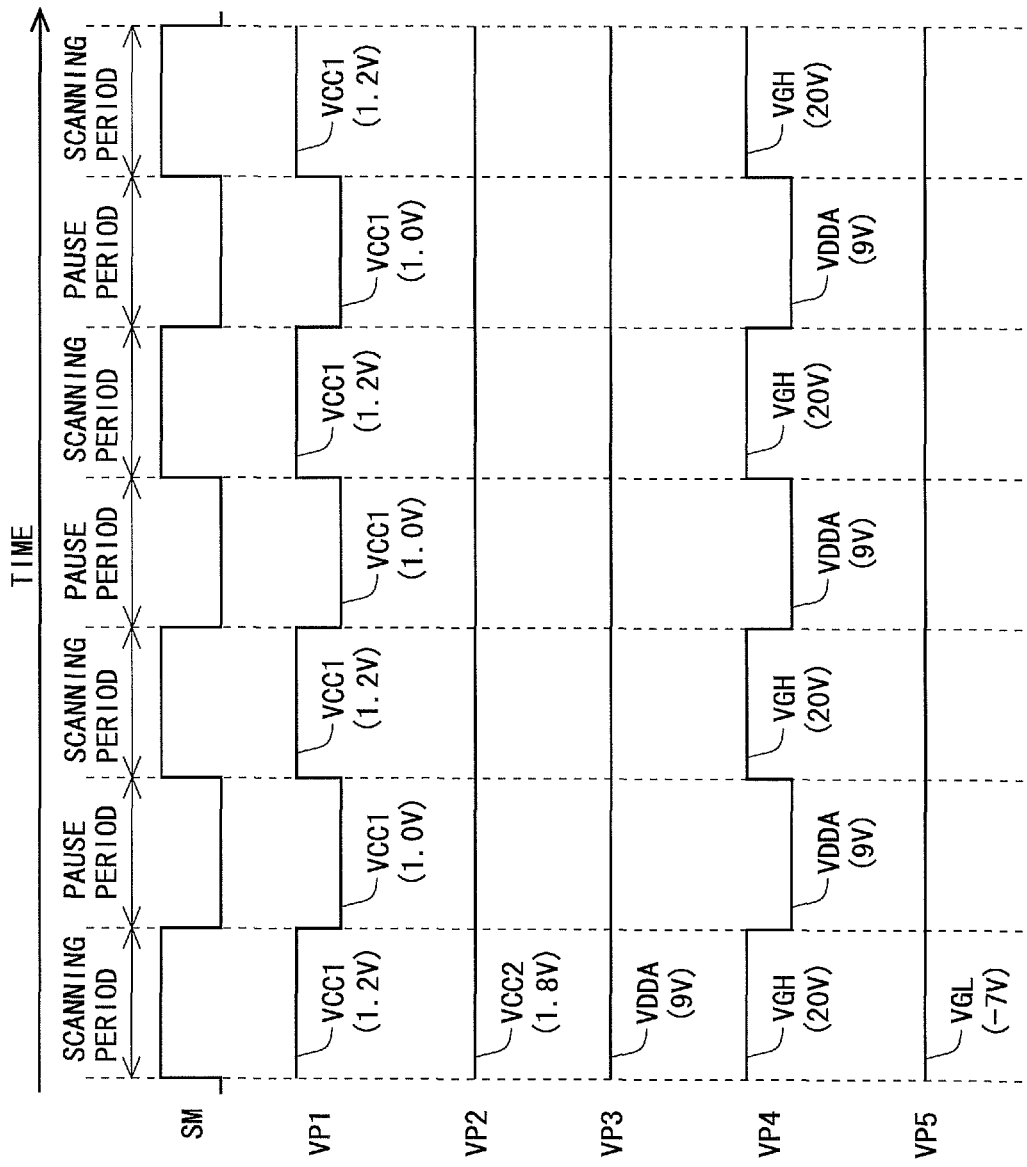
FIG. 22 is a timing chart for describing a voltage control method in the fifth embodiment.

Next, with reference to FIG. 22, a voltage control method in the present embodiment will be described. During the scanning period, a high-level control signal SM is provided to the power supply circuit 20 from the timing controller 310. By this, during the scanning period, the supply of operation voltages to the display driving unit 30 from the power supply circuit 20 is performed in the same manner as in the first embodiment. During the pause period, a low-level control signal SM is provided to the power supply circuit 20 from the timing controller 310. By this, during the pause period, operation voltages are supplied to the display driving unit 30 from the power supply circuit 20 as follows. A timing controller logic power supply voltage VCC1 of 1.0 V is supplied as a first voltage VP1, a source driver logic power supply voltage VCC2 of 1.8 V is supplied as a second voltage VP2, a source driver analog power supply voltage VDDA of 9 V is supplied as a third voltage VP3, a source driver analog power supply voltage VDDA of 9 V is supplied as a fourth voltage VP4, and a gate-off power supply voltage VGL of −7 V is supplied as a fifth voltage VP5.

As described above, in the present embodiment, as in the first embodiment, during the pause period, a source driver analog power supply voltage VDDA of 9 V is supplied to the gate driver 320, instead of a gate-on power supply voltage VGH of 20 V. In addition, in the present embodiment, as in the second embodiment, the voltage value of the timing controller logic power supply voltage VCC1 supplied to the timing controller 310 from the power supply circuit 20 is made smaller during the pause period than during the scanning period. Note that the reduction in the voltage value of the timing controller logic power supply voltage VCC1 is performed in a range in which the reduction does not affect the operation of the timing controller 310 during the pause period.

<5.3 Effect>

According to the present embodiment, during the pause period, a source driver analog power supply voltage VDDA of 9 V is supplied to the gate driver 320, instead of the gate-on power supply voltage VGH of 20 V. In addition, the voltage value of the timing controller logic power supply voltage VCC1 supplied to the timing controller 310 from the power supply circuit 20 is made smaller during the pause period than during the scanning period. By the above, as in the first embodiment, a display device adopting pause driving can further reduce power consumption over the conventional display device.

6. Sixth Embodiment

<6.1 Configuration>

Figure 23:
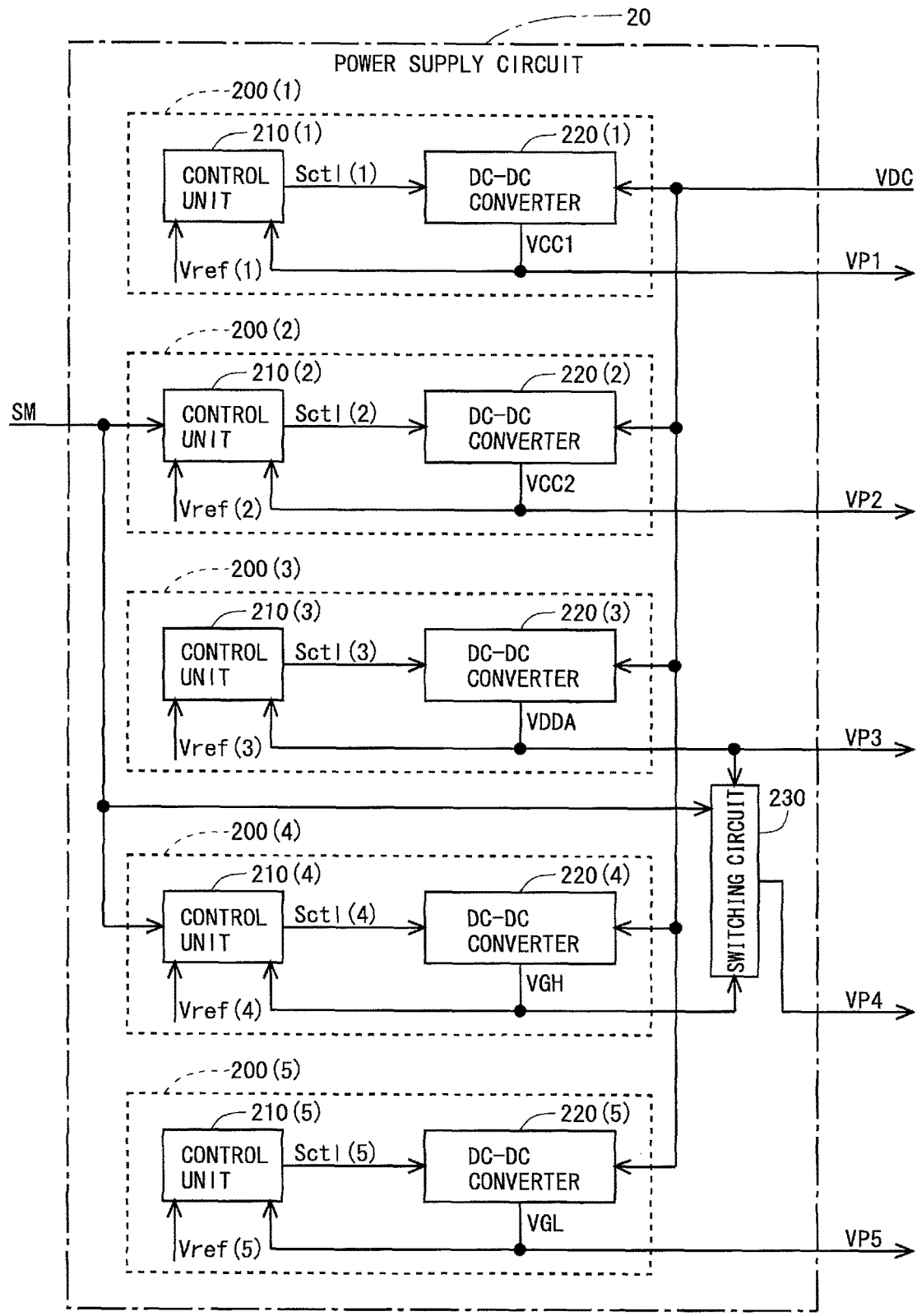
FIG. 23 is a block diagram showing a configuration of a power supply circuit in a sixth embodiment of the present invention.

A sixth embodiment of the present invention will be described. Note that description of the same things as in the first embodiment is omitted and differences from the first embodiment will be described. FIG. 23 is a block diagram showing a configuration of a power supply circuit 20 in the present embodiment. The power supply circuit 20 in the present embodiment is provided with a switching circuit 230 having the same configuration as that in the first embodiment. A control signal SM is provided to the switching circuit 230, a control unit 210(4) in a fourth power supply voltage generating unit 200(4), and a control unit 210(2) in a second power supply voltage generating unit 200(2).

<6.2 Voltage Control Method>

Figure 24:
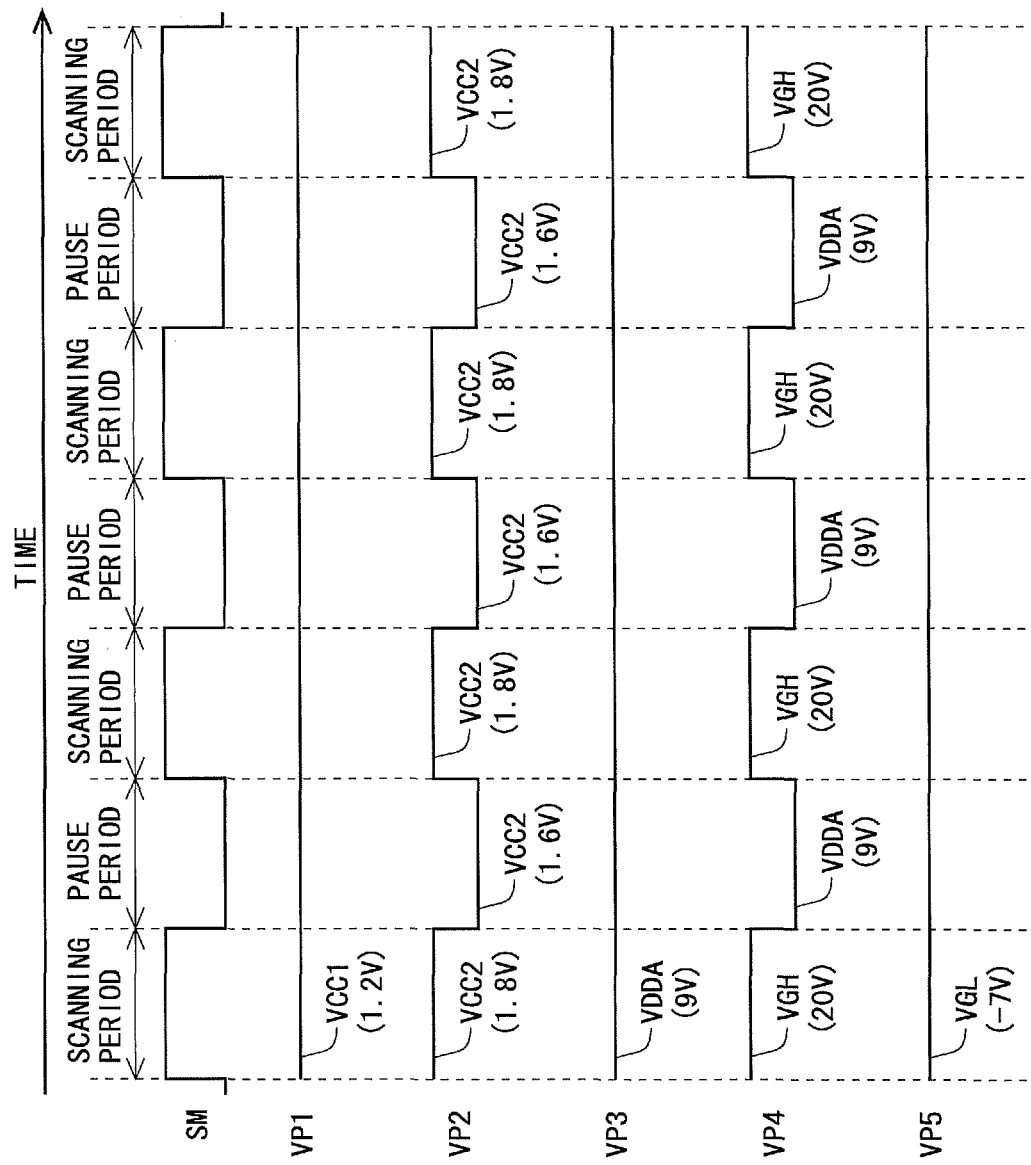
FIG. 24 is a timing chart for describing a voltage control method in the sixth embodiment.

Next, with reference to FIG. 24, a voltage control method in the present embodiment will be described. During the scanning period, a high-level control signal SM is provided to the power supply circuit 20 from the timing controller 310. By this, during the scanning period, the supply of operation voltages to the display driving unit 30 from the power supply circuit 20 is performed in the same manner as in the first embodiment. During the pause period, a low-level control signal SM is provided to the power supply circuit 20 from the timing controller 310. By this, during the pause period, operation voltages are supplied to the display driving unit 30 from the power supply circuit 20 as follows. A timing controller logic power supply voltage VCC1 of 1.2 V is supplied as a first voltage VP1, a source driver logic power supply voltage VCC2 of 1.6 V is supplied as a second voltage VP2, a source driver analog power supply voltage VDDA of 9 V is supplied as a third voltage VP3, a source driver analog power supply voltage VDDA of 9 V is supplied as a fourth voltage VP4, and a gate-off power supply voltage VGL of −7 V is supplied as a fifth voltage VP5.

As described above, in the present embodiment, as in the first embodiment, during the pause period, a source driver analog power supply voltage VDDA of 9 V is supplied to the gate driver 320, instead of a gate-on power supply voltage VGH of 20 V. In addition, in the present embodiment, as in the third embodiment, the voltage value of the source driver logic power supply voltage VCC2 supplied to the source driver 330 from the power supply circuit 20 is made smaller during the pause period than during the scanning period. Note that the reduction in the voltage value of the source driver logic power supply voltage VCC2 is performed in a range in which the reduction does not affect the operation of the source driver 330 during the pause period.

<6.3 Effect>

According to the present embodiment, during the pause period, a source driver analog power supply voltage VDDA of 9 V is supplied to the gate driver 320, instead of the gate-on power supply voltage VGH of 20 V. In addition, the voltage value of the source driver logic power supply voltage VCC2 supplied to the source driver 330 from the power supply circuit 20 is made smaller during the pause period than during the scanning period. By the above, as in the first embodiment, a display device adopting pause driving can further reduce power consumption over the conventional display device.

7. Seventh Embodiment

<7.1 Configuration>

Figure 25:
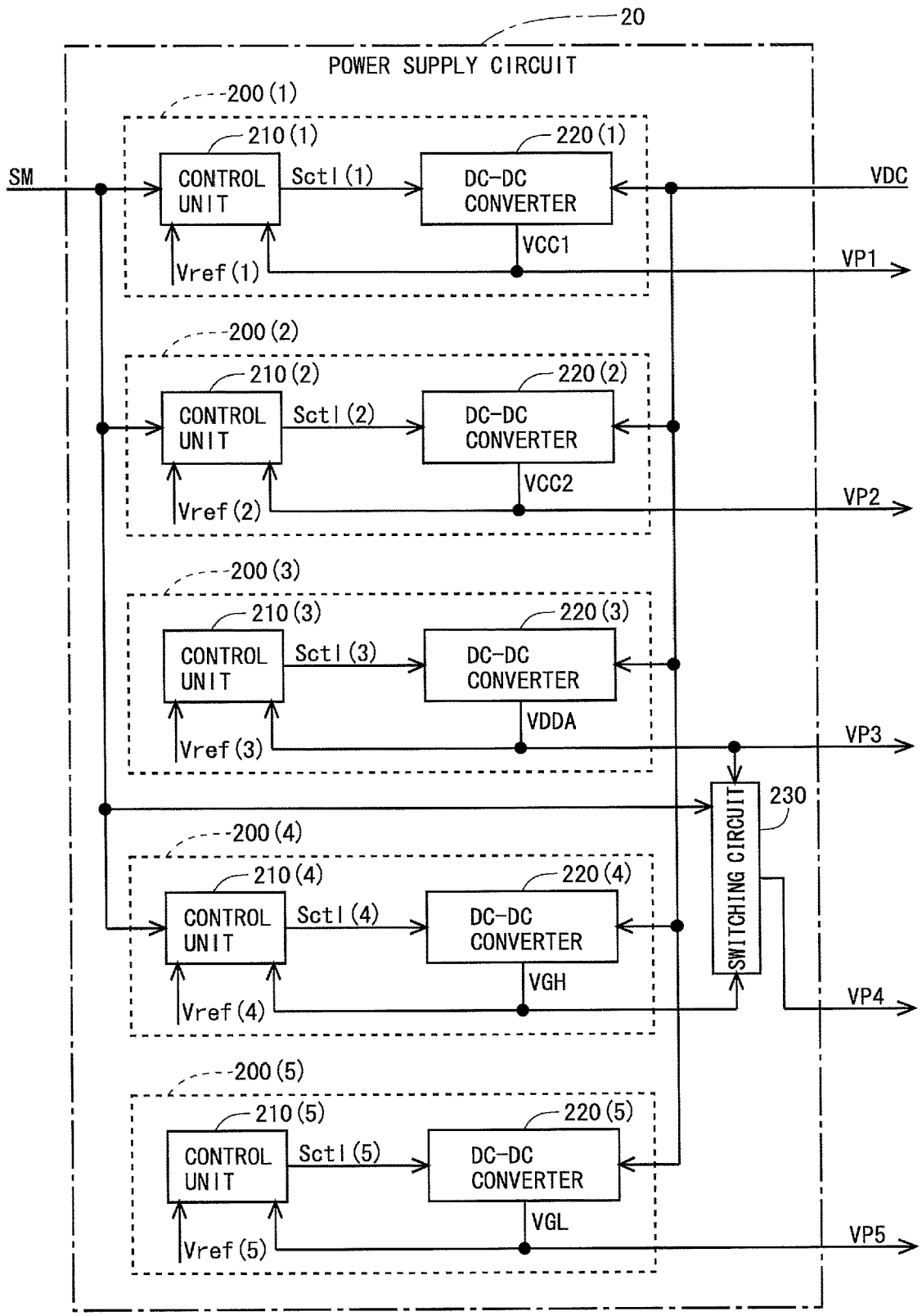
FIG. 25 is a block diagram showing a configuration of a power supply circuit in a seventh embodiment of the present invention.

A seventh embodiment of the present invention will be described. Note that description of the same things as in the first embodiment is omitted and differences from the first embodiment will be described. FIG. 25 is a block diagram showing a configuration of a power supply circuit 20 in the present embodiment. The power supply circuit 20 in the present embodiment is provided with a switching circuit 230 having the same configuration as that in the first embodiment. A control signal SM is provided to the switching circuit 230, a control unit 210(4) in a fourth power supply voltage generating unit 200(4), a control unit 210(1) in a first power supply voltage generating unit 200(1), and a control unit 210(2) in a second power supply voltage generating unit 200(2).

<7.2 Voltage Control Method>

Next, with reference to FIG. 26, a voltage control method in the present embodiment will be described. During the scanning period, a high-level control signal SM is provided to the power supply circuit 20 from the timing controller 310. By this, during the scanning period, the supply of operation voltages to the display driving unit 30 from the power supply circuit 20 is performed in the same manner as in the first embodiment. During the pause period, a low-level control signal SM is provided to the power supply circuit 20 from the timing controller 310. By this, during the pause period, operation voltages are supplied to the display driving unit 30 from the power supply circuit 20 as follows. A timing controller logic power supply voltage VCC1 of 1.0 V is supplied as a first voltage VP1, a source driver logic power supply voltage VCC2 of 1.6 V is supplied as a second voltage VP2, a source driver analog power supply voltage VDDA of 9 V is supplied as a third voltage VP3, a source driver analog power supply voltage VDDA of 9 V is supplied as a fourth voltage VP4, and a gate-off power supply voltage VGL of −7 V is supplied as a fifth voltage VP5.

As described above, in the present embodiment, as in the first embodiment, during the pause period, a source driver analog power supply voltage VDDA of 9 V is supplied to the gate driver 320, instead of a gate-on power supply voltage VGH of 20 V. In addition, in the present embodiment, as in the second embodiment, the voltage value of the timing controller logic power supply voltage VCC1 supplied to the timing controller 310 from the power supply circuit 20 is made smaller during the pause period than during the scanning period. Note that the reduction in the voltage value of the timing controller logic power supply voltage VCC1 is performed in a range in which the reduction does not affect the operation of the timing controller 310 during the pause period. Furthermore, in the present embodiment, as in the third embodiment, the voltage value of the source driver logic power supply voltage VCC2 supplied to the source driver 330 from the power supply circuit 20 is made smaller during the pause period than during the scanning period. Note that the reduction in the voltage value of the source driver logic power supply voltage VCC2 is performed in a range in which the reduction does not affect the operation of the source driver 330 during the pause period.

<7.3 Effect>

According to the present embodiment, during the pause period, a source driver analog power supply voltage VDDA of 9 V is supplied to the gate driver 320, instead of a gate-on power supply voltage VGH of 20 V. In addition, the voltage value of the timing controller logic power supply voltage VCC1 supplied to the timing controller 310 from the power supply circuit 20 is made smaller during the pause period than during the scanning period. Furthermore, the voltage value of the source driver logic power supply voltage VCC2 supplied to the source driver 330 from the power supply circuit 20 is made smaller during the pause period than during the scanning period. By the above, as in the first embodiment, a display device adopting pause driving can further reduce power consumption over the conventional display device.

<8. Others>

The present invention is not limited to the above-described embodiments, and various modifications may be made without departing from the true spirit and scope of the present invention. In addition, the voltage value of each operation voltage described above is an example and specific voltage values are not particularly limited.

This application claims priority to Japanese Patent Application No. 2015-235320 titled "Display Device and Driving Method Thereof" filed Dec. 2, 2015, the content of which is included herein by reference.

DESCRIPTION OF REFERENCE CHARACTERS

4: PIXEL FORMATION PORTION
20: POWER SUPPLY CIRCUIT
30: DISPLAY DRIVING UNIT
40: LIQUID CRYSTAL PANEL
200(1) to 200(5): FIRST TO FIFTH POWER SUPPLY VOLTAGE GENERATING UNIT
210(1) to 210(5): CONTROL UNIT
220(1) to 220(5): DC-DC CONVERTER
230: SWITCHING CIRCUIT
310: TIMING CONTROLLER
320: GATE DRIVER (SCANNING SIGNAL LINE DRIVE CIRCUIT)
330: SOURCE DRIVER (VIDEO SIGNAL LINE DRIVE CIRCUIT)
400: DISPLAY UNIT
VCC1: TIMING CONTROLLER LOGIC POWER SUPPLY VOLTAGE
VCC2: SOURCE DRIVER LOGIC POWER SUPPLY VOLTAGE
VDDA: SOURCE DRIVER ANALOG POWER SUPPLY VOLTAGE
VGH: GATE-ON POWER SUPPLY VOLTAGE
VGL: GATE-OFF POWER SUPPLY VOLTAGE

The invention claimed is:

1. A display device having a display unit that includes a video signal line and a scanning signal line, and performing pause driving that repeats a scanning period during which the scanning signal line is scanned and a pause period during which the scanning of the scanning signal line is stopped, the display device comprising:

a display driving unit configured to drive the display unit; and a power supply circuit configured to generate a plurality of operation voltages to be supplied to the display driving unit, wherein the display driving unit provides a control signal to the power supply circuit, the control signal indicating whether a current point in time is the scanning period or the pause period, the power supply circuit makes a voltage value of at least one of the plurality of operation voltages supplied to the display driving unit smaller during the pause period than during the scanning period, based on the control signal, the display driving unit includes:

a video signal line drive circuit configured to drive the video signal line;

a scanning signal line drive circuit configured to drive the scanning signal line; and a timing control circuit configured to control operation of the video signal line drive circuit and the scanning signal line drive circuit, and the control signal is provided to the power supply circuit from the timing control circuit, and the power supply circuit:

generates, as the plurality of operation voltages, at least an analog power supply voltage to be supplied to the video signal line drive circuit, a scanning signal line selection power supply voltage to be supplied to the scanning signal line drive circuit, and a first logic power supply voltage to be supplied to the timing control circuit, the scanning signal line selection power supply voltage being a voltage for bringing the scanning signal line into a selected state; and supplies the analog power supply voltage to the scanning signal line drive circuit during the pause period, instead of the scanning signal line selection power supply voltage, and makes a voltage value of the first logic power supply voltage smaller during the pause period than during the scanning period.

2. The display device according to claim 1, wherein the display unit includes:

a pixel electrode; and a thin film transistor including a control terminal connected to the scanning signal line, a first conduction terminal connected to the video signal line, and a second conduction terminal connected to the pixel electrode, the thin film transistor being made of an oxide semiconductor layer.

3. The display device according to claim 2, wherein the oxide semiconductor layer contains indium gallium zinc oxide.

4. The display device according to claim 1, wherein a length of the pause period is longer than a length of the scanning period.

5. A display device having a display unit that includes a video signal line and a scanning signal line, and performing pause driving that repeats a scanning period during which the scanning signal line is scanned and a pause period during which the scanning of the scanning signal line is stopped, the display device comprising:
- a display driving unit configured to drive the display unit; and
- a power supply circuit configured to generate a plurality of operation voltages to be supplied to the display driving unit, wherein
- the display driving unit provides a control signal to the power supply circuit, the control signal indicating whether a current point in time is the scanning period or the pause period,
- the power supply circuit makes a voltage value of at least one of the plurality of operation voltages supplied to the display driving unit smaller during the pause period than during the scanning period, based on the control signal,
- the display driving unit includes:
  - a video signal line drive circuit configured to drive the video signal line;
  - a scanning signal line drive circuit configured to drive the scanning signal line; and
  - a timing control circuit configured to control operation of the video signal line drive circuit and the scanning signal line drive circuit, and
  - the control signal is provided to the power supply circuit from the timing control circuit, and
- the power supply circuit:
  - generates, as the plurality of operation voltages, at least an analog power supply voltage to be supplied to the video signal line drive circuit, a scanning signal line selection power supply voltage to be supplied to the scanning signal line drive circuit, and a second logic power supply voltage to be supplied to the video signal line drive circuit, the scanning signal line selection power supply voltage being a voltage for bringing the scanning signal line into a selected state; and
  - supplies the analog power supply voltage to the scanning signal line drive circuit during the pause period, instead of the scanning signal line selection power supply voltage, and makes a voltage value of the second logic power supply voltage smaller during the pause period than during the scanning period.

6. The display device according to claim 5, wherein the display includes:
- a pixel electrode; and
- a thin film transistor including a control terminal connected to the scanning signal line, a first conduction terminal connected to the video signal line, and a second conduction terminal connected to the pixel electrode, the thin film transistor being made of an oxide semiconductor layer.

7. The display device according to claim 6, wherein the oxide semiconductor layer contains indium gallium zinc oxide.

8. The display device according to claim 5, wherein a length of the pause period is longer than a length of the scanning period.

9. A display device having a display unit that includes a video signal line and a scanning signal line, and performing pause driving that repeats a scanning period during which the scanning signal line is scanned and a pause period during which the scanning of the scanning signal line is stopped, the display device comprising:
- a display driving unit configured to drive the display unit; and
- a power supply circuit configured to generate a plurality of operation voltages to be supplied to the display driving unit, wherein
- the display driving unit provides a control signal to the power supply circuit, the control signal indicating whether a current point in time is the scanning period or the pause period,
- the power supply circuit makes a voltage value of at least one of the plurality of operation voltages supplied to the display driving unit smaller during the pause period than during the scanning period, based on the control signal,
- the display driving unit includes:
  - a video signal line drive circuit configured to drive the video signal line;
  - a scanning signal line drive circuit configured to drive the scanning signal line; and
  - a timing control circuit configured to control operation of the video signal line drive circuit and the scanning signal line drive circuit, and
  - the control signal is provided to the power supply circuit from the timing control circuit, and
- the power supply circuit:
  - generates, as the plurality of operation voltages, at least an analog power supply voltage to be supplied to the video signal line drive circuit, a scanning signal line selection power supply voltage to be supplied to the scanning signal line drive circuit, a first logic power supply voltage to be supplied to the timing control circuit, and a second logic power supply voltage to be supplied to the video signal line drive circuit, the scanning signal line selection power supply voltage being a voltage for bringing the scanning signal line into a selected state; and
  - supplies the analog power supply voltage to the scanning signal line drive circuit during the pause period, instead of the scanning signal line selection power supply voltage, and makes a voltage value of the first logic power supply voltage and a voltage value of the second logic power supply voltage smaller during the pause period than during the scanning period.

10. The display device according to claim 9, wherein the display includes:
- a pixel electrode; and
- a thin film transistor including a control terminal connected to the scanning signal line, a first conduction terminal connected to the video signal line, and a second conduction terminal connected to the pixel electrode, the thin film transistor being made of an oxide semiconductor layer.

11. The display device according to claim 10, wherein the oxide semiconductor layer contains indium gallium zinc oxide.

12. The display device according to claim 9, wherein a length of the pause period is longer than a length of the scanning period.

* * * * *